(12) United States Patent
Yang et al.

(10) Patent No.: US 11,437,300 B2
(45) Date of Patent: Sep. 6, 2022

(54) SEMICONDUCTOR DEVICES INCLUDING SUPPORTER

(71) Applicant: Samsung Electronics Co., Ltd., Suwon-si (KR)

(72) Inventors: Woosung Yang, Gwangmyeong-si (KR); Jiyoung Kim, Hwaseong-si (KR); Jiwon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 200 days.

(21) Appl. No.: 16/989,017

(22) Filed: Aug. 10, 2020

(65) Prior Publication Data

US 2021/0225739 A1    Jul. 22, 2021

(30) Foreign Application Priority Data

Jan. 20, 2020   (KR) ................. 10-2020-0007187

(51) Int. Cl.
*H01L 23/48* (2006.01)
*H01L 27/11582* (2017.01)
*H01L 27/11575* (2017.01)
*H01L 27/11573* (2017.01)

(52) U.S. Cl.
CPC ...... *H01L 23/481* (2013.01); *H01L 27/11582* (2013.01)

(58) Field of Classification Search
CPC ............. H01L 23/481; H01L 27/11582; H01L 27/11575; H01L 27/11565; H01L 27/11573; H01L 27/11529; H01L 27/11556; H01L 27/1157; H01L 29/66833; H01L 29/792
See application file for complete search history.

(56) References Cited

U.S. PATENT DOCUMENTS

| | | |
|---|---|---|
| 9,870,991 B1 | 1/2018 | Kim et al. |
| 9,881,929 B1 | 1/2018 | Ravikirthi et al. |
| 10,038,006 B2 | 7/2018 | Furihata et al. |
| 10,115,632 B1 | 10/2018 | Masamori et al. |
| 10,192,880 B2 | 1/2019 | Lee |

(Continued)

FOREIGN PATENT DOCUMENTS

KR    20180051183 A    5/2018

*Primary Examiner* — Herve-Louis Y Assouman
(74) *Attorney, Agent, or Firm* — Harness, Dickey & Pierce, P.L.C.

(57) ABSTRACT

A semiconductor device includes a substrate including a cell region and a connection region. The connection region includes a plurality of pad regions and a through electrode region. A horizontal conductive layer is on the substrate. A supporter is on the horizontal conductive layer. The supporter includes a first portion in the cell region, a second portion in the plurality of pad regions, and a third portion in the through electrode region. A connection conductive layer is between the first portion and the horizontal conductive layer. A connection mold layer is between the third portion and the horizontal conductive layer. A first buried insulation layer passing through the third portion, the connection mold layer, and the horizontal conductive layer is provided. A stacked structure is on the substrate. A through electrode passing through the first buried insulation layer is provided.

20 Claims, 40 Drawing Sheets

(56) References Cited

U.S. PATENT DOCUMENTS

| | | |
|---|---|---|
| 10,553,602 B2 | 2/2020 | Lee |
| 2010/0090286 A1* | 4/2010 | Lee .................. H01L 29/66833 |
| | | 257/E27.081 |
| 2018/0374869 A1 | 12/2018 | Kim et al. |
| 2019/0157294 A1 | 5/2019 | Kanamori et al. |
| 2019/0267333 A1* | 8/2019 | Hong ................ H01L 27/11582 |

* cited by examiner

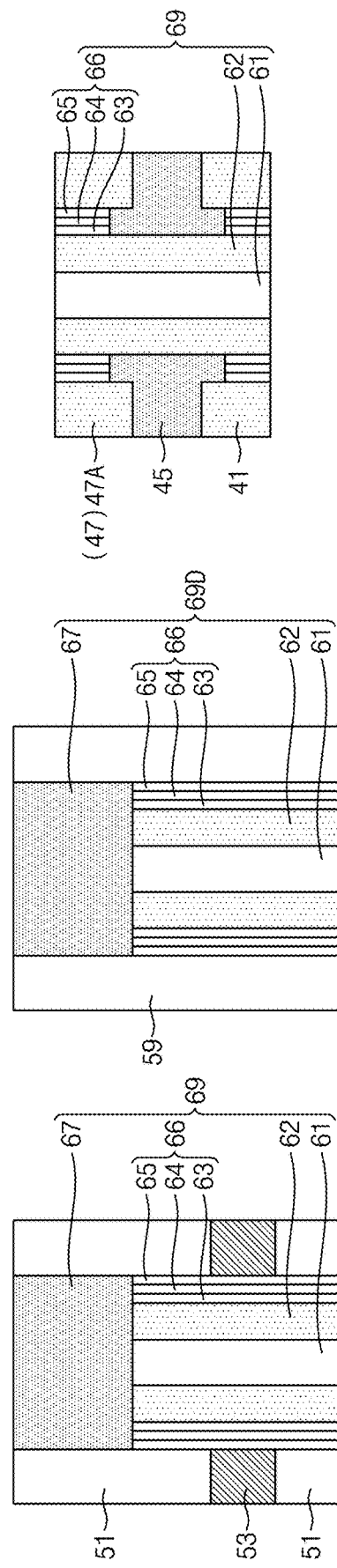

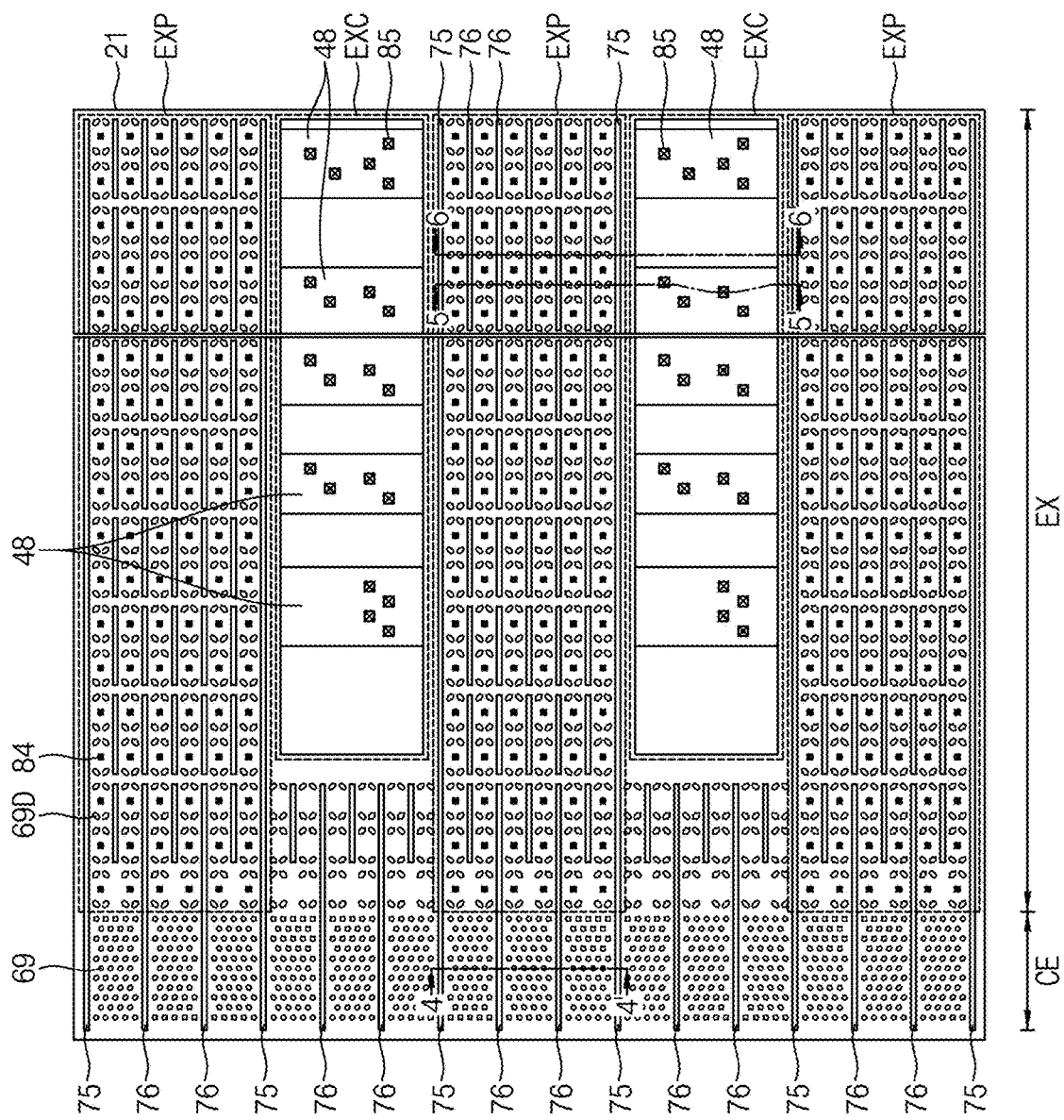

SEMICONDUCTOR DEVICES INCLUDING SUPPORTER

CROSS-REFERENCE TO THE RELATED APPLICATION

This U.S. non-provisional patent application claims priority from Korean Patent Application No. 10-2020-0007187, filed on Jan. 20, 2020, in the Korean Intellectual Property Office (KIPO), the disclosure of which is incorporated herein by reference in its entirety.

BACKGROUND

1. Field

The inventive concepts relate to semiconductor devices including a supporter and a method of manufacturing the semiconductor devices.

2. Description of the Related Art

As semiconductor devices are highly integrated, technology which places a source line on a substrate and forms a stacked structure on the source line is being developed. The stacked structure may include a plurality of insulation layers and a plurality of wiring layers, which are alternately and repeatedly stacked. A channel structure, which passes through the stacked structure and is connected to the source line, may be disposed. An increase in a leakage current between the plurality of wiring layers and the source line causes a defective characteristic of a semiconductor device.

SUMMARY

Example embodiments of the disclosure provide semiconductor devices and a method of manufacturing the same, which increase production efficiency and/or reduces or minimizes a leakage current.

A semiconductor device in accordance with example embodiments of the disclosure may include a substrate including a cell region and a connection region. The connection region may connect with the cell region. The connection region may include a plurality of pad regions and a through electrode region between the plurality of pad regions. A horizontal conductive layer may be on the substrate. A supporter, which is on the horizontal conductive layer and includes a first portion in the cell region, a second portion in the plurality of pad regions, and a third portion in the through electrode region, may be provided. A connection conductive layer may be between the first portion of the supporter and the horizontal conductive layer. A connection mold layer may be between the third portion of the supporter and the horizontal conductive layer. A first buried insulation layer, which is in the through electrode region and passes through the third portion, the connection mold layer, and the horizontal conductive layer, may be provided. A stacked structure, where a plurality of insulation layers and a plurality of wiring layers are alternately stacked, may be on the substrate. A cell channel structure, which is in the cell region, passes through a stacked structure and the first portion, and extends to an inner portion of the horizontal conductive layer, may be provided. A through electrode, which is in the through electrode region and passes through the first buried insulation layer, may be provided.

A semiconductor device in accordance with example embodiments of the disclosure may include a substrate including a cell region and a connection region. The connection region may connect with the cell region. The connection region may include a plurality of pad regions and a through electrode region between the plurality of pad regions. A horizontal conductive layer may be on the substrate. A supporter, which is on the horizontal conductive layer and includes a first portion in the cell region, a second portion in the plurality of pad regions, and a third portion in the through electrode region, may be provided. A connection conductive layer may be between the first portion of the supporter and the horizontal conductive layer. A connection mold layer may be between the third portion of the supporter and the horizontal conductive layer. A first buried insulation layer, which is in the through electrode region and passes through the third portion, the connection mold layer, and the horizontal conductive layer, may be provided. A second buried insulation layer, which is in the plurality of pad regions and covers the second portion, may be provided. A stacked structure, where a plurality of insulation layers and a plurality of wiring layers are alternately stacked, may be on the supporter, the first buried insulation layer, and the second buried insulation layer. A cell channel structure, which is in the cell region, passes through the stacked structure and the first portion, and extends to an inner portion of the horizontal conductive layer, may be provided. A dummy channel structure, which is in the plurality of pad regions, passes through the stacked structure, the second buried insulation layer, and the second portion, and extends to an inner portion of the horizontal conductive layer, may be provided. A through electrode, which is in the through electrode region and passes through the stacked structure and the first buried insulation layer, may be provided.

A semiconductor device in accordance with example embodiments of the disclosure may include a substrate including a cell region and a connection region. The connection region may connect with the cell region. The connection region may include a plurality of pad regions and a through electrode region between the plurality of pad regions. A horizontal conductive layer may be on the substrate. A supporter, which is on the horizontal conductive layer and includes a first portion in the cell region, a second portion in the plurality of pad regions, and a third portion in the through electrode region, may be provided. A connection conductive layer may be between the first portion of the supporter and the horizontal conductive layer. A connection mold layer may be between the third portion of the supporter and the horizontal conductive layer. A first buried insulation layer, which is in the through electrode region and passes through the third portion, the connection mold layer, and the horizontal conductive layer, may be provided. A second buried insulation layer, which is in the plurality of pad regions and covers the second portion, may be provided. A cell channel structure, which is in the cell region, passes through a stacked structure where a plurality of insulation layers and a plurality of wiring layers are alternately stacked and the first portion, and extends to an inner portion of the horizontal conductive layer, may be provided. A through electrode, which is in the through electrode region and passes through the first buried insulation layer, may be provided. A bit line, which is on the stacked structure and is connected to the cell channel structure, may be provided.

A method of manufacturing a semiconductor device in accordance with example embodiments of the disclosure may include providing a substrate including a cell region and a connection region connecting with the cell region. The connection region may include a plurality of pad regions and a through electrode region between the plurality of pad regions. A horizontal conductive layer may be formed on the substrate. A supporter may be formed on the horizontal conductive layer. The supporter may include a first portion in the cell region, a second portion in the plurality of pad regions, and a third portion in the through electrode region. A connection conductive layer may be formed between the first portion of the supporter and the horizontal conductive layer. A connection mold layer may be formed between the third portion of the supporter and the horizontal conductive layer. A first buried insulation layer passing through the third portion, the connection mold layer, and the horizontal conductive layer may be formed in the through electrode region. A stacked structure, where a plurality of insulation layers and a plurality of wiring layers which are alternately stacked, may be formed on the substrate. A cell channel structure passing through the stacked structure and the first portion and extending to an inner portion of the horizontal conductive layer may be formed in the cell region. A through electrode passing through the first buried insulation layer may be in the through electrode region.

A semiconductor device in accordance with example embodiments of the disclosure may include a substrate including a cell region and a connection region. The connection region may connect with the cell region. The connection region may include a plurality of pad regions and a through electrode region between the plurality of pad regions. A horizontal conductive layer may be on the substrate. A supporter, which is on the horizontal conductive layer and includes a first portion in the cell region, a second portion in the plurality of pad regions, and a third portion in the through electrode region, may be provided. A connection conductive layer may be between the first portion of the supporter and the horizontal conductive layer. A connection mold layer may be between the third portion of the supporter and the horizontal conductive layer. A stacked structure, where a plurality of insulation layers and a plurality of wiring layers are alternately stacked, may be on the substrate. A cell channel structure, which is in the cell region, passes through the stacked structure and the first portion, and extends to an inner portion of the horizontal conductive layer, may be provided. A through electrode, which is in the through electrode region and passes through the third portion, the connection mold layer, and the horizontal conductive layer, may be provided. A contact spacer surrounding a side surface of the through electrode may be provided.

A semiconductor device in accordance with example embodiments of the disclosure may include a substrate including a cell region and a connection region. The connection region may connect with the cell region. The connection region may include a plurality of pad regions and a through electrode region between the plurality of pad regions. A horizontal conductive layer may be on the substrate. A supporter, which is on the horizontal conductive layer and includes a first portion in the cell region and a second portion in the plurality of pad regions, may be provided. A connection conductive layer may be between the first portion of the supporter and the horizontal conductive layer. A first buried insulation layer, which is in the through electrode region and passes through the second portion and the horizontal conductive layer, may be provided. A stacked structure, where a plurality of insulation layers and a plurality of wiring layers are alternately stacked, may be on the supporter and the first buried insulation layer. A cell channel structure, which is in the cell region, passes through the stacked structure, the first portion, and the connection conductive layer, and extends to an inner portion of the horizontal conductive layer, may be provided. A dummy channel structure, which is in the connection region, passes through the stacked structure and the second portion, and extends to an inner portion of the horizontal conductive layer, may be provided. A through electrode, which is in the through electrode region and passes through the stacked structure and the first buried insulation layer, may be provided. A distance between an uppermost end of the second portion and a top surface of the substrate may be shorter than a distance between an uppermost end of the first portion and the top surface of the substrate.

BRIEF DESCRIPTION OF THE DRAWINGS

FIGS. 3, 8, 12 and 16 are layouts for describing semiconductor devices according to example embodiments of the disclosure.

FIGS. 5 to 7 are enlarged views illustrating a portion of FIG. 1.

DETAILED DESCRIPTION OF EXAMPLE EMBODIMENTS

Figure 1:
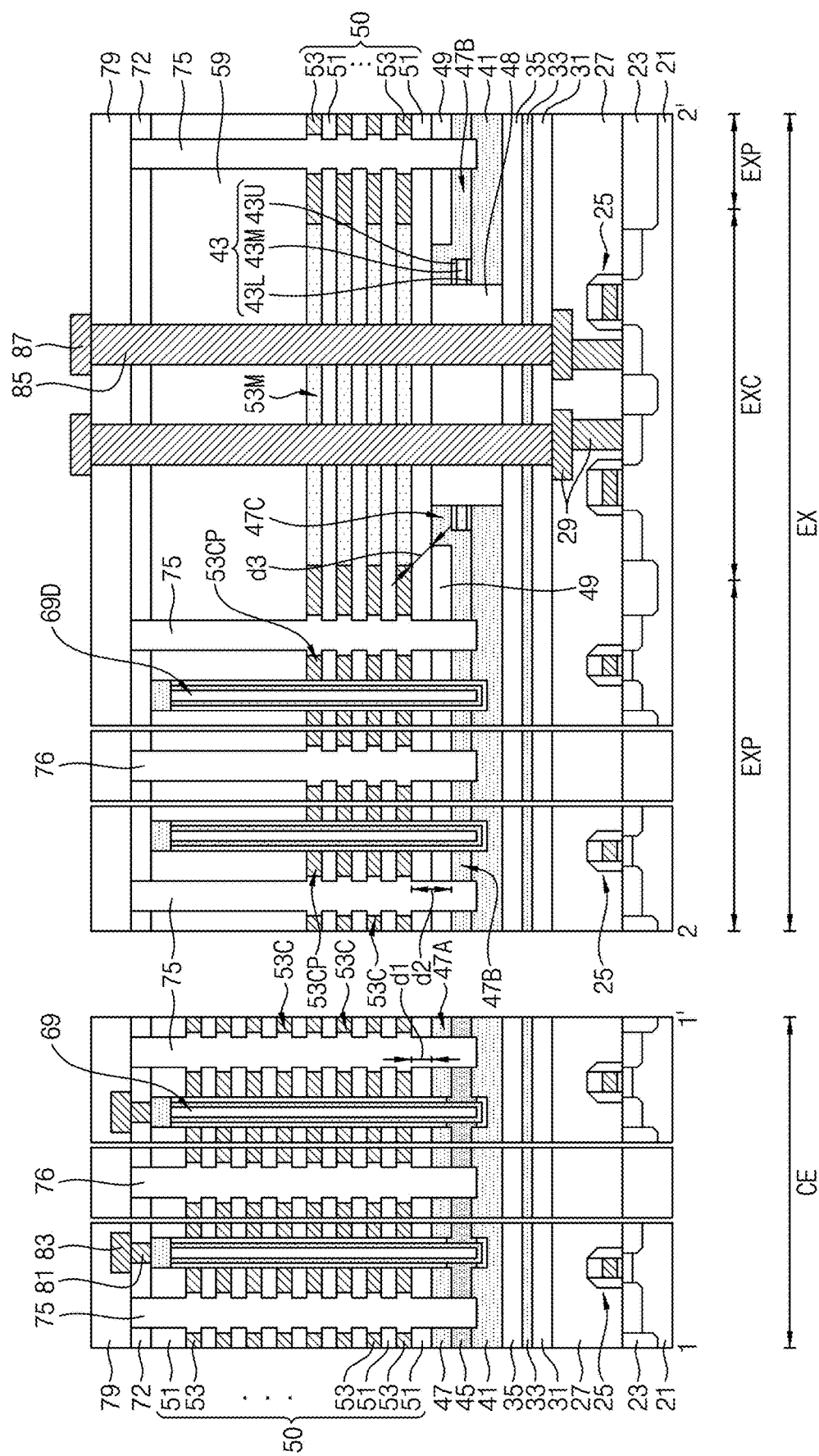
FIGS. 1, 2, 10, 11, 14, 15, 18, 19, 20 and 21 are cross-sectional views for describing semiconductor devices according to example embodiments of the disclosure.
Figure 2:
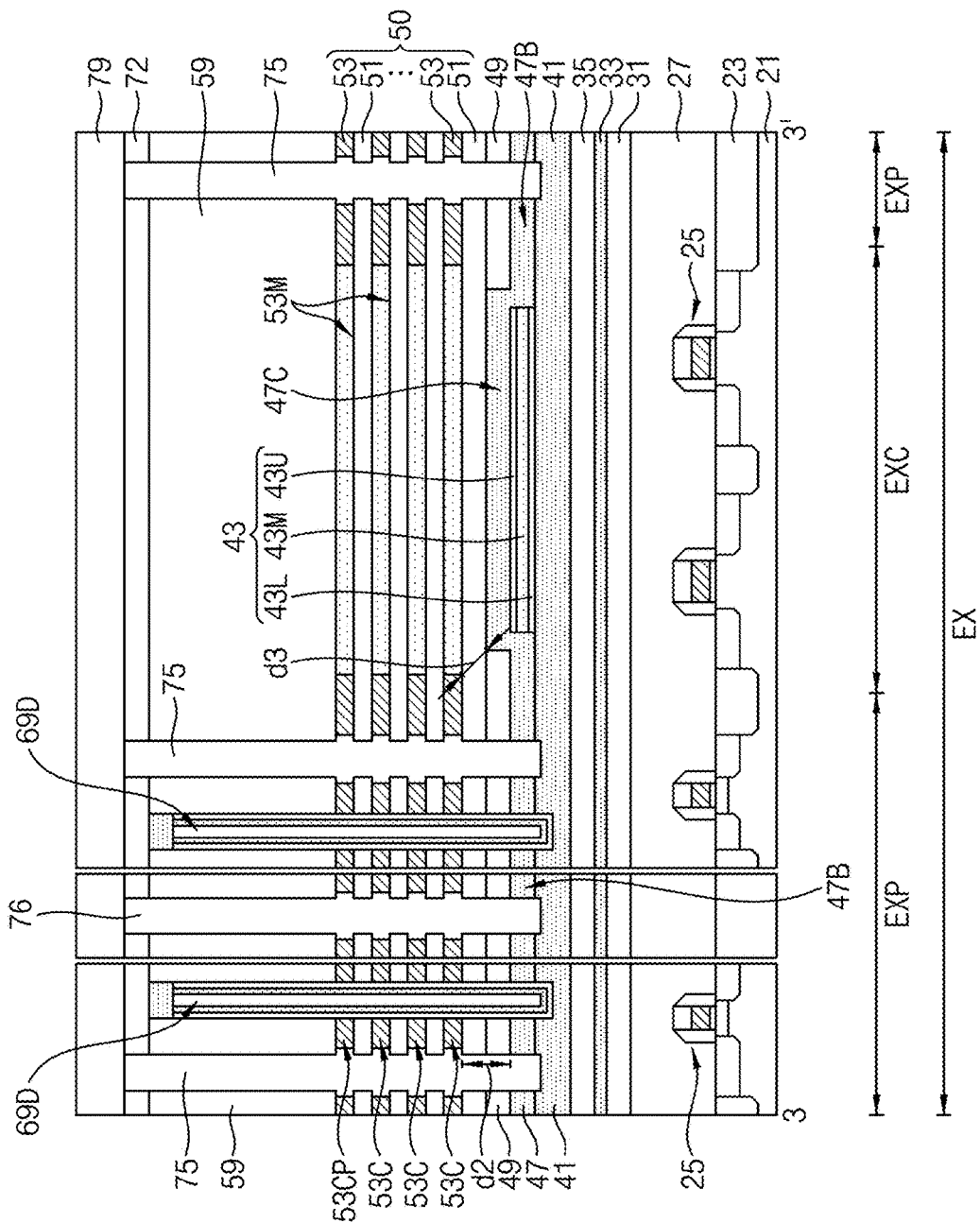
Figure 3:
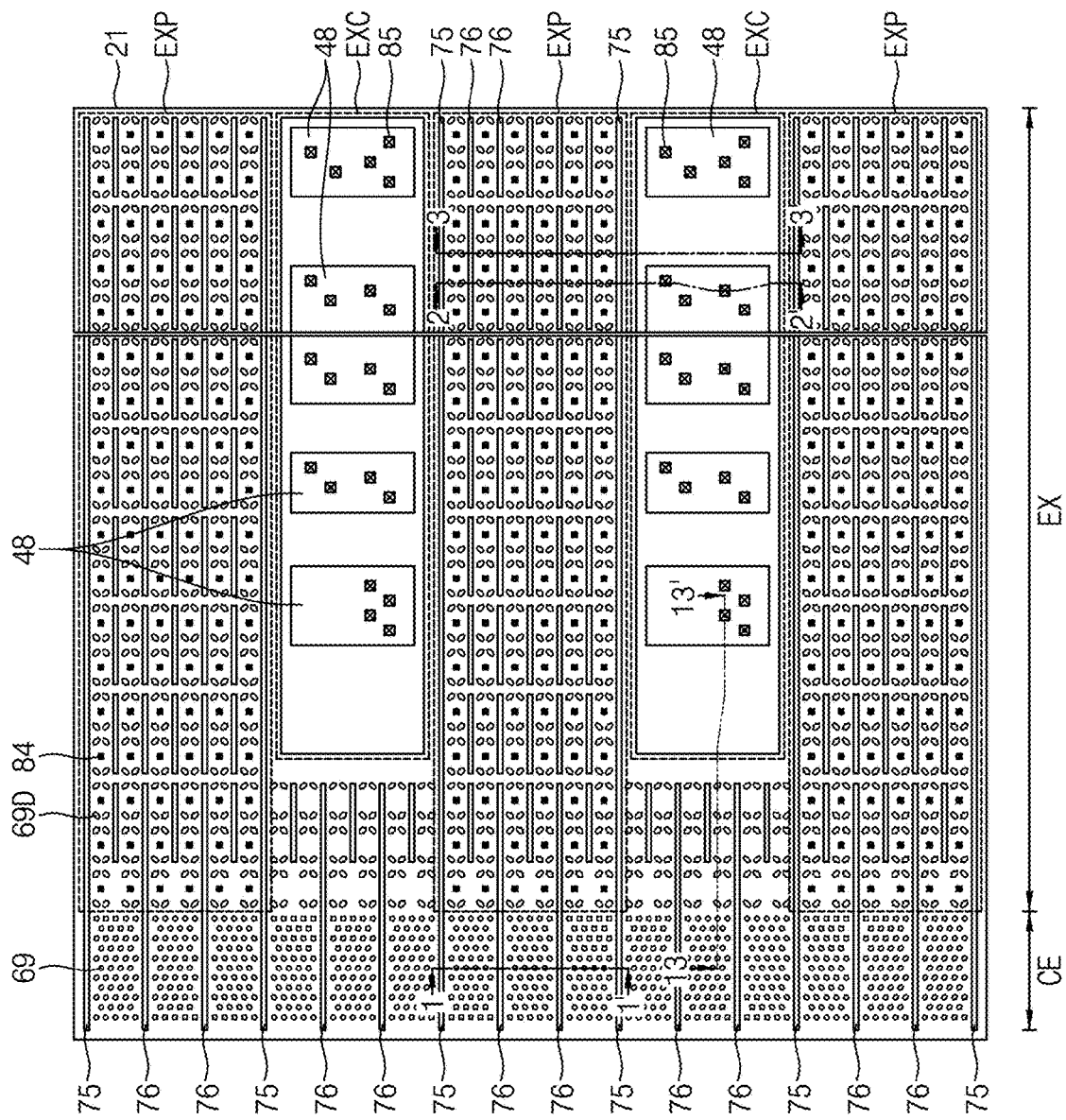
Figure 4:
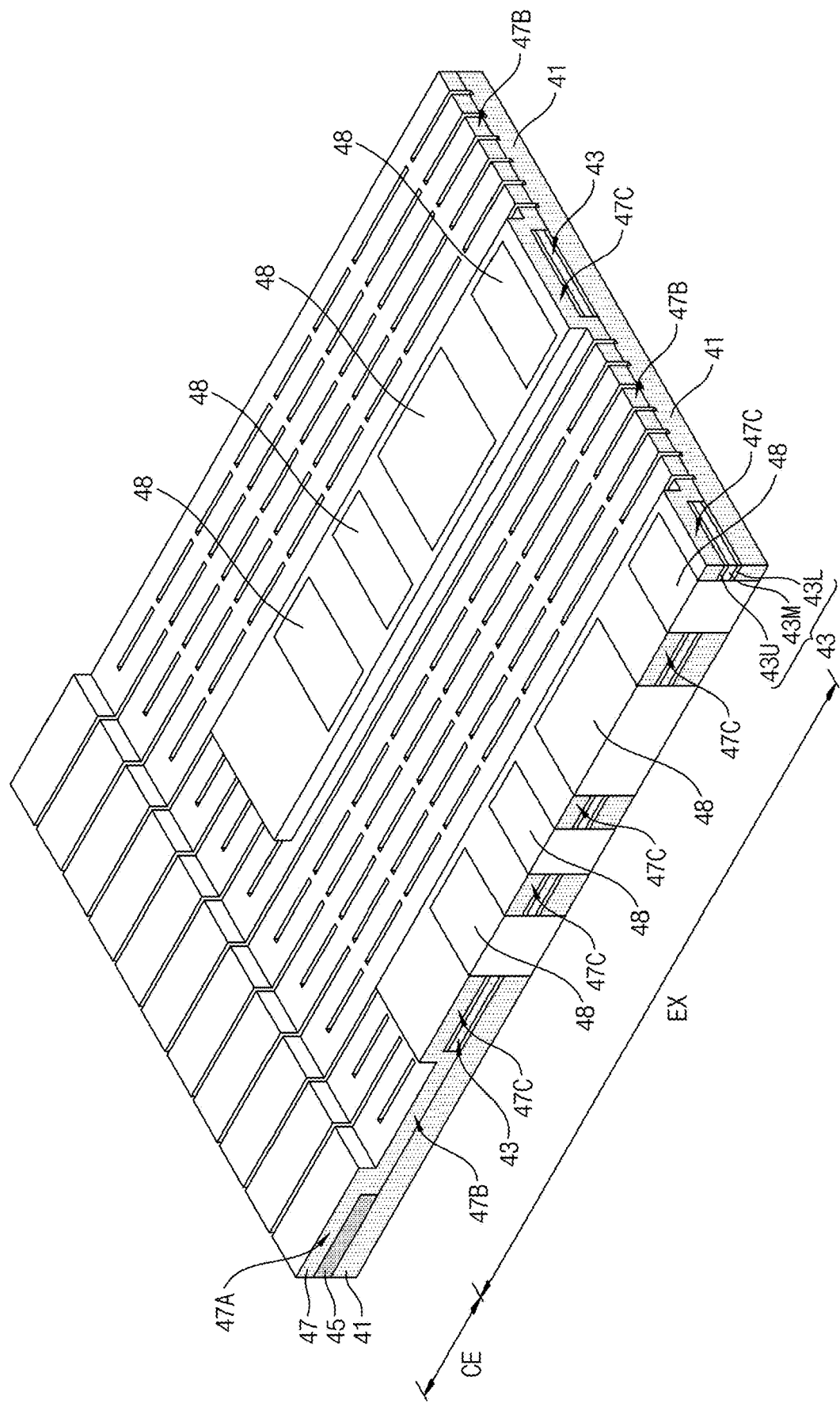
FIGS. 4, 9, 13 and 17 are perspective views for describing some elements of semiconductor devices according to example embodiments of the disclosure.

FIGS. 1 and 2 are cross-sectional views for describing semiconductor devices according to example embodiments of the disclosure, and FIG. 3 is a layout for describing semiconductor devices. FIG. 4 is a perspective view for describing some elements of FIGS. 1 to 3, and FIGS. 5 to 7 are enlarged views illustrating a portion of FIG. 1. FIG. 1 is a cross-sectional view taken along lines 1-1' and 2-2' of FIG. 3, and FIG. 2 is a cross-sectional view taken along line 3-3' of FIG. 3. The semiconductor devices according to example embodiments of the disclosure may include a non-volatile memory such as VNAND or three-dimensional (3D) flash memory. The semiconductor devices according to example embodiments of the disclosure may be construed as including a cell on peripheral (COP) structure.

Referring to FIG. 1, the semiconductor devices according to example embodiments of the disclosure may include a substrate 21, an isolation layer 23, a plurality of transistors 25, a first lower insulation layer 27, a plurality of peripheral circuit wirings 29, a second lower insulation layer 31, a capping layer 33, a third lower insulation layer 35, a horizontal conductive layer 41, a connection mold layer 43, a connection conductive layer 45, a supporter 47, a first buried insulation layer 48, a second buried insulation layer 49, a stacked structure 50, an interlayer insulation layer 59, a plurality of cell channel structures 69, a plurality of dummy channel structures 69D, a first upper insulation layer 72, a plurality of separation patterns 75, a plurality of middle separation patterns 76, a second upper insulation layer 79, a plurality of bit plugs 81, a plurality of bit lines 83, a plurality of through electrodes 85, and/or a plurality of upper wirings 87.

The substrate 21 may include a cell region CE and a connection region EX connecting with the cell region CE.

The connection region EX may include a plurality of pad regions EXP and a through electrode region EXC between the plurality of pad regions EXP. The connection mold layer 43 may include a first connection mold layer 43L, a second connection mold layer 43M, and a third connection mold layer 43U.

The supporter 47 may include a first portion 47A in the cell region CE, a second portion 47B in the plurality of pad regions EXP, and a third portion 47C in the through electrode region EXC. The stacked structure 50 may include a plurality of insulation layers 51 and a plurality of wiring layers 53, which are alternately and repeatedly stacked. Each of the plurality of wiring layers 53 may include an electrode layer 53C and a mold layer 53M connecting with the electrode layer 53C. A portion of the electrode layer 53C may act as a pad 53CP.

Referring to FIG. 2, a connection mold layer 43 may be disposed on a horizontal conductive layer 41 in a through electrode region EXC. A third portion 47C of a supporter 47 may be disposed on the connection mold layer 43. A mold layer 53M may be aligned on the third portion 47C. A second portion 47B of the supporter 47 may be disposed on a horizontal conductive layer 41 in a plurality of pad regions EXP. The second buried insulation layer 49 may be disposed on the second portion 47B.

Referring to FIG. 3, a substrate 21 may include a cell region CE and a connection region EX connecting with the cell region CE. The connection region EX may include a plurality of pad regions EXP and a plurality of through electrode regions EXC between the plurality of pad regions EXP. The cell region CE and a plurality of separation patterns 75 crossing the connection region EX may be disposed on the substrate 21. A plurality of middle separation patterns 76 may be disposed between the plurality of separation patterns 75. A plurality of cell channel structures 69 may be disposed in the cell region CE. A plurality of dummy channel structures 69D may be disposed in the connection region EX. A plurality of gate contact plugs 84 may be disposed in the plurality of pad regions EXP. A first buried insulation layer 48 may be disposed in the plurality of through electrode regions EXC. A plurality of through electrodes 85 may be disposed in the first buried insulation layer 48.

Referring to FIGS. 3 and 4, the connection conductive layer 45 may be disposed on the horizontal conductive layer 41 in the cell region CE. The connection mold layer 43 may be disposed on the horizontal conductive layer 41 in the plurality of through electrode regions EXC.

The supporter 47 may include the first portion 47A, the second portion 47B, and the third portion 47C. The first portion 47A may be disposed on the connection conductive layer 45 in the cell region CE. The second portion 47B may connect with the first portion 47A. The second portion 47B may be disposed on the horizontal conductive layer 41 in the connection region EX. The second portion 47B may be disposed on the horizontal conductive layer 41 in the plurality of pad regions EXP. A bottom surface of the second portion 47B may directly contact a top surface of the horizontal conductive layer 41 in the plurality of pad regions EXP. A connection region between the first portion 47A and the second portion 47B may have a step. The third portion 47C may connect with the second portion 47B. The third portion 47C may be disposed on the connection mold layer 43 in the plurality of through electrode regions EXC. A connection region between the second portion 47B and the third portion 47C may have a step.

The first buried insulation layer 48 passing through the third portion 47C, the connection mold layer 43, and the horizontal conductive layer 41 may be disposed in the plurality of through electrode regions EXC. Top surfaces of the first portion 47A, the third portion 47C, and the first buried insulation layer 48 may be substantially coplanar. A top surface of the second portion 47B may be disposed at a level which is lower than the top surfaces of the first portion 47A, the third portion 47C, and the first buried insulation layer 48.

Referring to FIG. 5, each of a plurality of cell channel structures 69 may include a core pattern 61, a channel layer 62 surrounding an outer portion of the core pattern 61, an information storage pattern 66 surrounding an outer portion of the channel layer 62, and a bit pad 67. The information storage pattern 66 may include a tunnel insulation layer 63 surrounding an outer portion of the channel layer 62, a charge storage layer 64 surrounding an outer portion of the tunnel insulation layer 63, and a blocking layer 65 surrounding an outer portion of the charge storage layer 64.

The core pattern 61 may include silicon oxide, silicon nitride, silicon oxynitride, low-K dielectrics, high-K dielectrics, polysilicon, or a combination thereof. The channel layer 62 may include a semiconductor layer such as polysilicon, amorphous silicon, crystalline silicon, or a combination thereof. The tunnel insulation layer 63 may include an insulation layer such as silicon nitride. The charge storage layer 64 may include an insulation layer such as silicon nitride. The blocking layer may include an insulation layer such as silicon oxide, silicon nitride, silicon oxynitride, high-K dielectrics, or a combination thereof. The bit pad 67 may include a conductive layer such as metal, metal nitride, metal oxide, metal silicide, conductive carbon, polysilicon, or a combination thereof.

Referring to FIG. 6, the plurality of dummy channel structures 69D may include a configuration similar to that of each of the plurality of cell channel structures 69. Each of the plurality of dummy channel structures 69D may include a core pattern 61, a channel layer 62, an information storage layer 66, and a bit pad 67. The information storage layer 66 may include a tunnel insulation layer 63, a charge storage layer 64, and a blocking layer 65.

Referring to FIG. 7, the connection conductive layer 45 may be disposed between the first portion 47A of the supporter 47 and the horizontal conductive layer 41. The connection conductive layer 45 may pass through the information storage layer 66 and may directly contact a side surface of the channel layer 62.

Referring again to FIGS. 1 to 7, the horizontal conductive layer 41 may correspond to a source line or a common source line (CSL). A lowermost layer of the plurality of electrode layers 53C may correspond to a gate-induced drain leakage (GIDL) control line. A second layer with respect to a bottom among the plurality of electrode layers 53C may correspond to a ground selection line (GSL). An uppermost layer of the plurality of electrode layers 53C may correspond to a GIDL control line. A second layer and a third layer with respect to a top among the plurality of electrode layers 53C may each correspond to a string selection line (GSL) or a drain selection line (DSL). Some of the plurality of electrode layers 53C may each correspond to a word line. The plurality of separation patterns 75 and the plurality of middle separation patterns 76 may each correspond to a word line cut.

The horizontal conductive layer 41 may be disposed on the substrate 21. The supporter 47 may be disposed on the horizontal conductive layer 41. The connection conductive layer 45 may be disposed between the first portion 47A of the supporter 47 and the horizontal conductive layer 41. A bottom surface of the second portion 47B of the supporter 47 may directly contact the horizontal conductive layer 41. The second buried insulation layer 49 may be disposed on the second portion 47B.

The connection mold layer 43 may be disposed between the third portion 47C of the supporter 47 and the horizontal conductive layer 41. A thickness of the connection mold layer 43 may be the same or substantially the same as an interval between the first portion 47A and the horizontal conductive layer 41. The first buried insulation layer 48 may be disposed in the through electrode region EXC. The first buried insulation layer 48 may pass through the third portion 47C, the connection mold layer 43, and the horizontal conductive layer 41. The first buried insulation layer 48 may directly contact side surfaces of the third portion 47C, the connection mold layer 43, and the horizontal conductive layer 41.

A distance between an uppermost end of the second portion 47B and a top surface of the substrate 21 may be shorter than a distance between an uppermost end of the first portion 47A and the top surface of the substrate 21. The distance between the uppermost end of the second portion 47B and the top surface of the substrate 21 may be shorter than a distance between an uppermost end of the third portion 47C and the top surface of the substrate 21. Top surfaces of the first portion 47A, the second buried insulation layer 49, the third portion 47C, and the first buried insulation layer 48 may be substantially coplanar.

The stacked structure 50 may be disposed on the supporter 47, the second buried insulation layer 49, the third portion 47C, and the first buried insulation layer 48. A minimum interval between the wiring layer 53 and the second portion 47B may be greater than a minimum interval between the wiring layer 53 and the first portion 47A. A minimum interval between the electrode layer 53C and the first portion 47A may be a first distance d1. A minimum interval between the electrode layer 53C and the second portion 47B may be a second distance d2. The second distance d2 may be greater than the first distance d1. The mold layer 53M may be aligned on the third portion 47C. The mold layer 53M may cover the third portion 47C. A horizontal width of the mold layer 53M may be greater than that of the third portion 47C. A minimum interval between the electrode layer 53C and the third portion 47C may be a third distance d3. In the semiconductor devices according to example embodiments of the disclosure, a leakage current between the supporter 47 and the electrode layer 53C may be considerably reduced.

Each of the plurality of cell channel structures 69 may pass through the stacked structure 50, the first portion 47A, and the connection conductive layer 45 and may extend to an inner portion of the horizontal conductive layer 41. Each of the plurality of dummy channel structures 69D may pass through the interlayer insulation layer 59, the stacked structure 50, the second buried insulation layer 49, and the second portion 47B and may extend to an inner portion of the horizontal conductive layer 41.

The plurality of through electrodes 85, which pass through the second upper insulation layer 79, the first upper insulation layer 72, the interlayer insulation layer 59, the stacked structure 50, the first buried insulation layer 48, the third lower insulation layer 35, the capping layer 33, and the second lower insulation layer 31 and are connected to the plurality of peripheral circuit wirings 29, may be disposed in the through electrode region EXC. The mold layer 53M may be aligned on the first buried insulation layer 48. The mold layer 53M may cover the first buried insulation layer 48. A horizontal width of the mold layer 53M may be greater than that of the first buried insulation layer 48. The plurality of through electrodes 85 may pass through the mold layer 53M.

Figure 9:
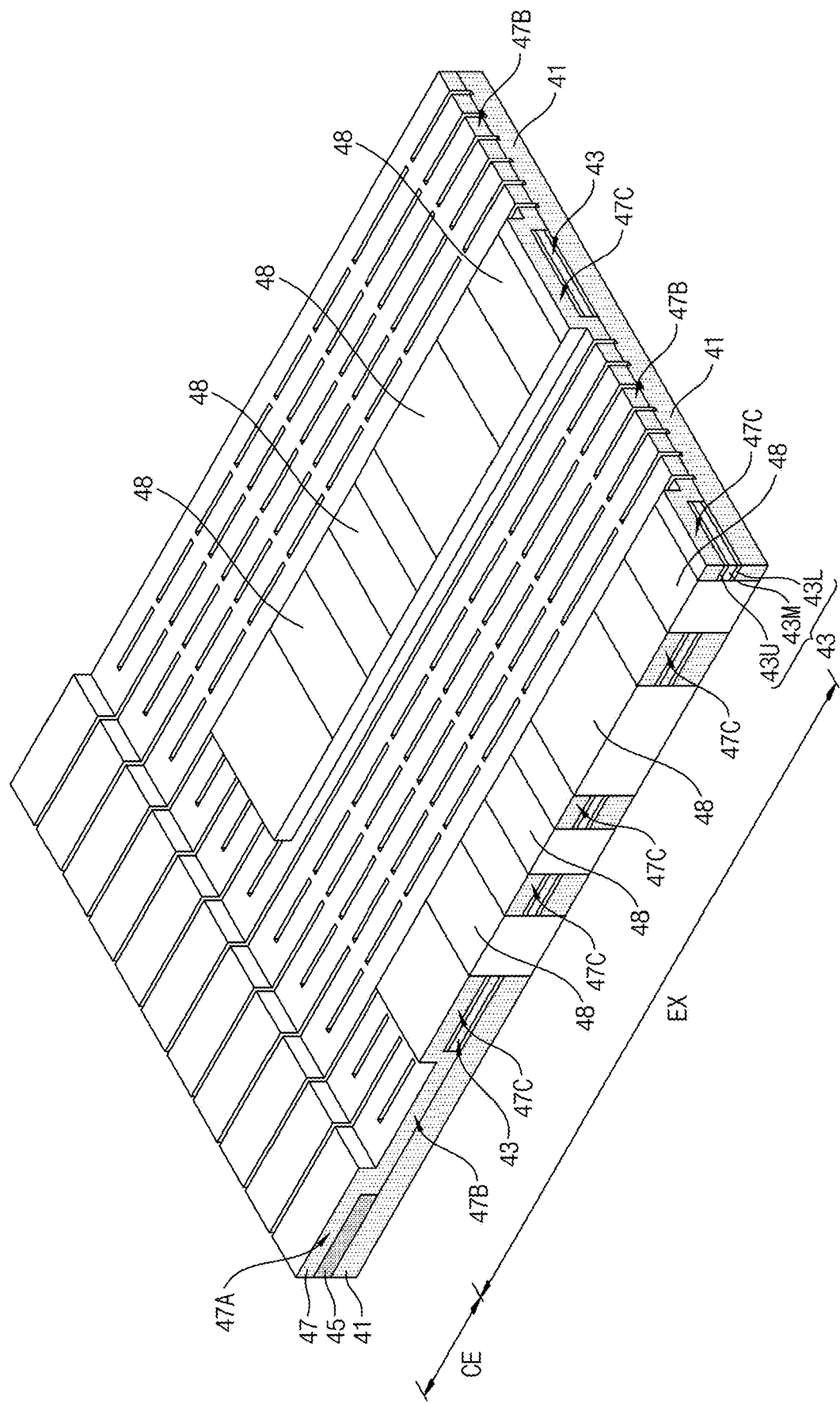
Figure 10:
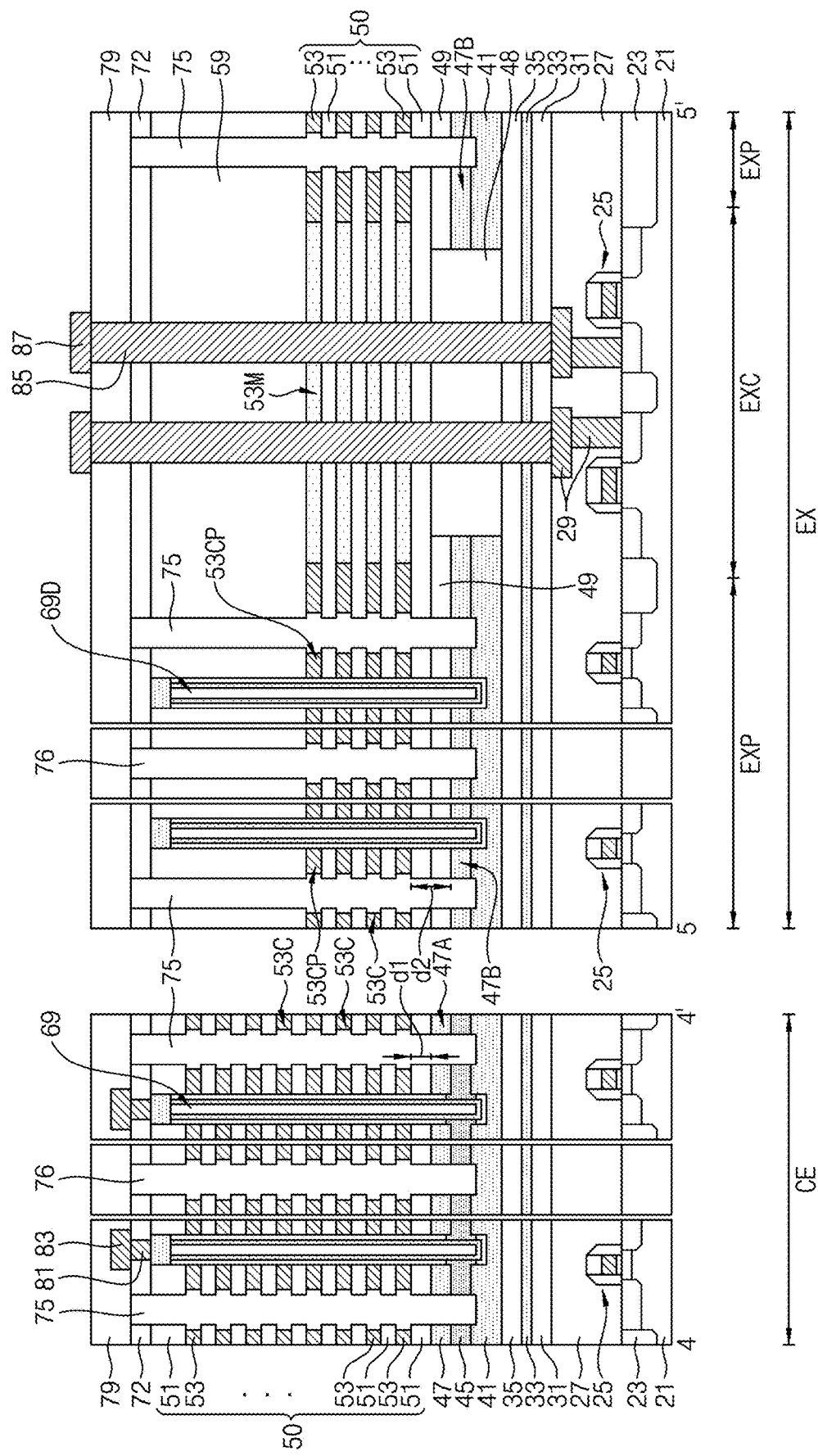
Figure 11:
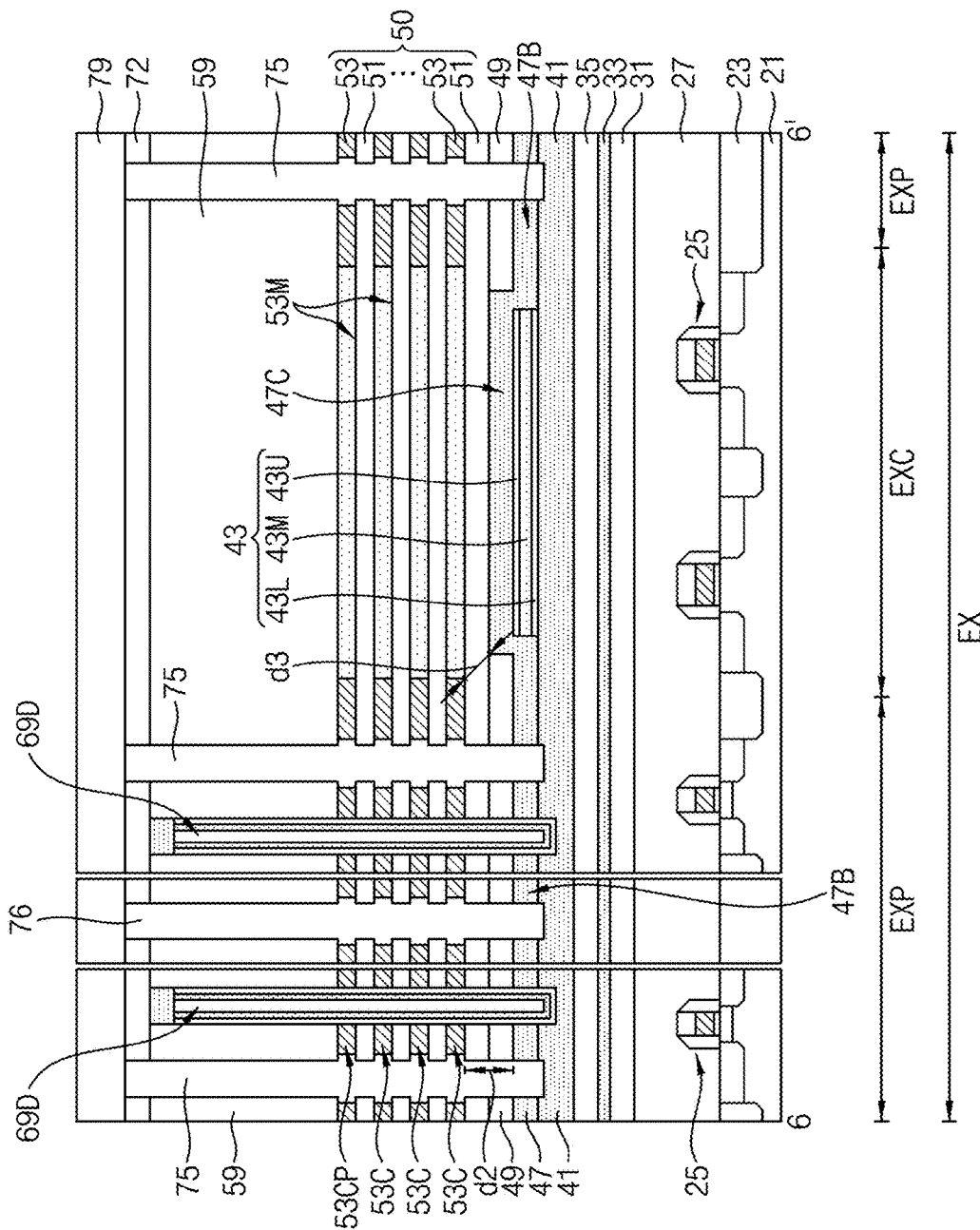

FIG. 8 is a layout for describing semiconductor devices according to example embodiments of the disclosure, and FIG. 9 is a perspective view for describing semiconductor devices. FIG. 10 is a cross-sectional view taken along lines 4-4' and 5-5' of FIG. 8, and FIG. 11 is a cross-sectional view taken along line 6-6' of FIG. 8.

Referring to FIGS. 8 to 11, a first buried insulation layer 48 may fully cross a third portion 47C of a supporter 47. The third portion 47C may be divided into a plurality of portions by the first buried insulation layer 48 may fully cross a connection mold layer 43. The connection mold layer 43 may be divided into a plurality of portions by the first buried insulation layer 48.

Figure 12:
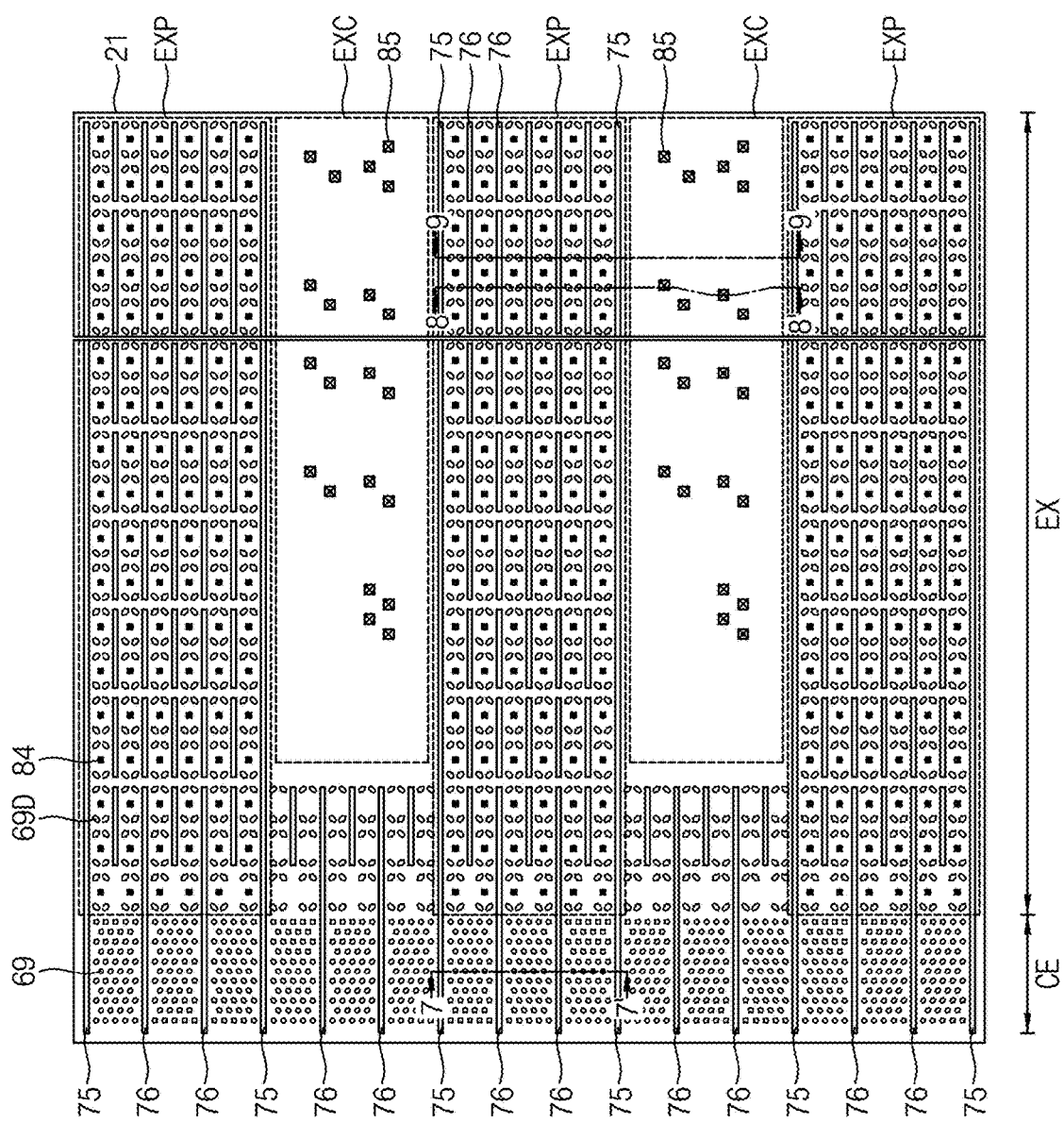
Figure 13:
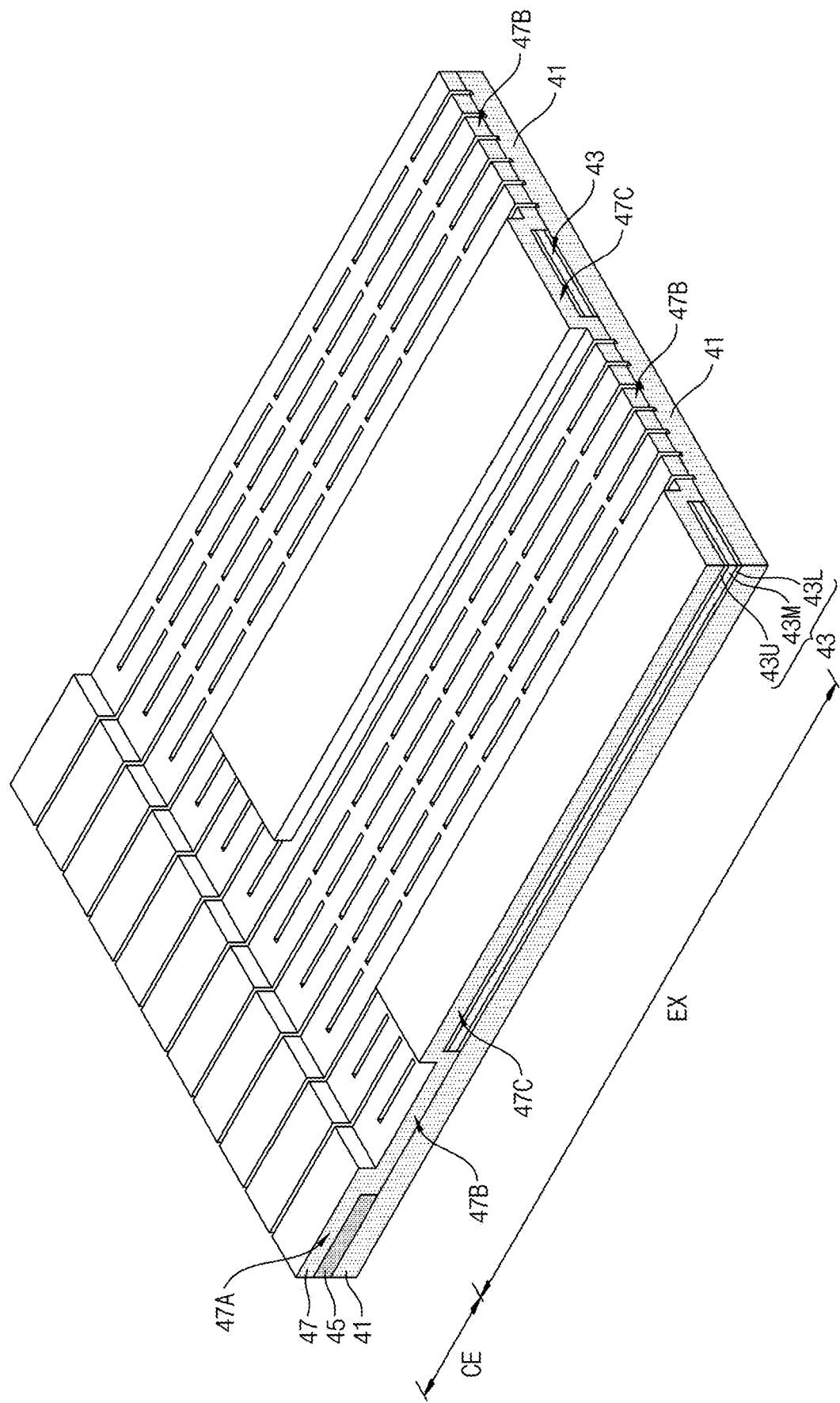
Figure 14:
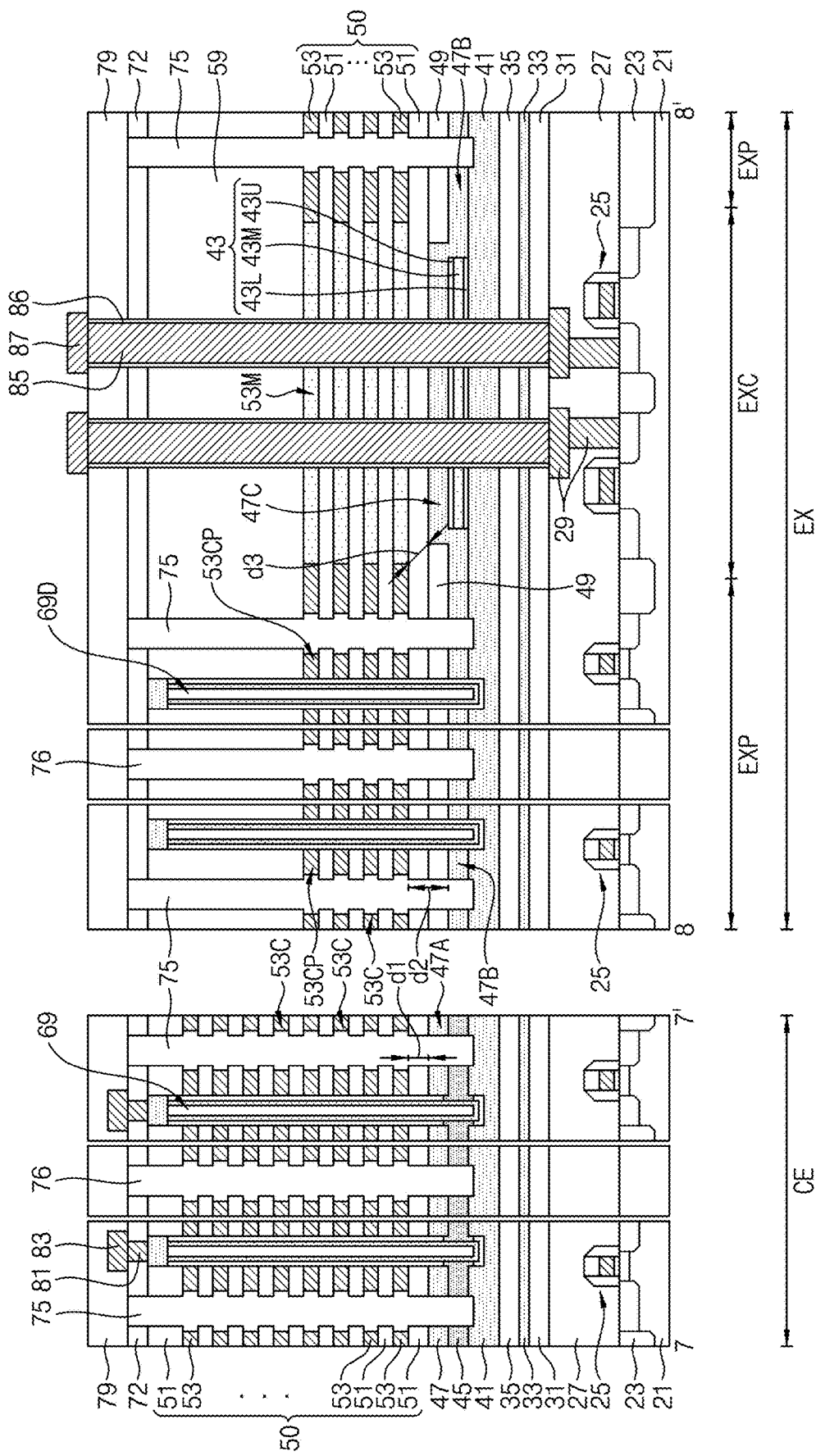
Figure 15:
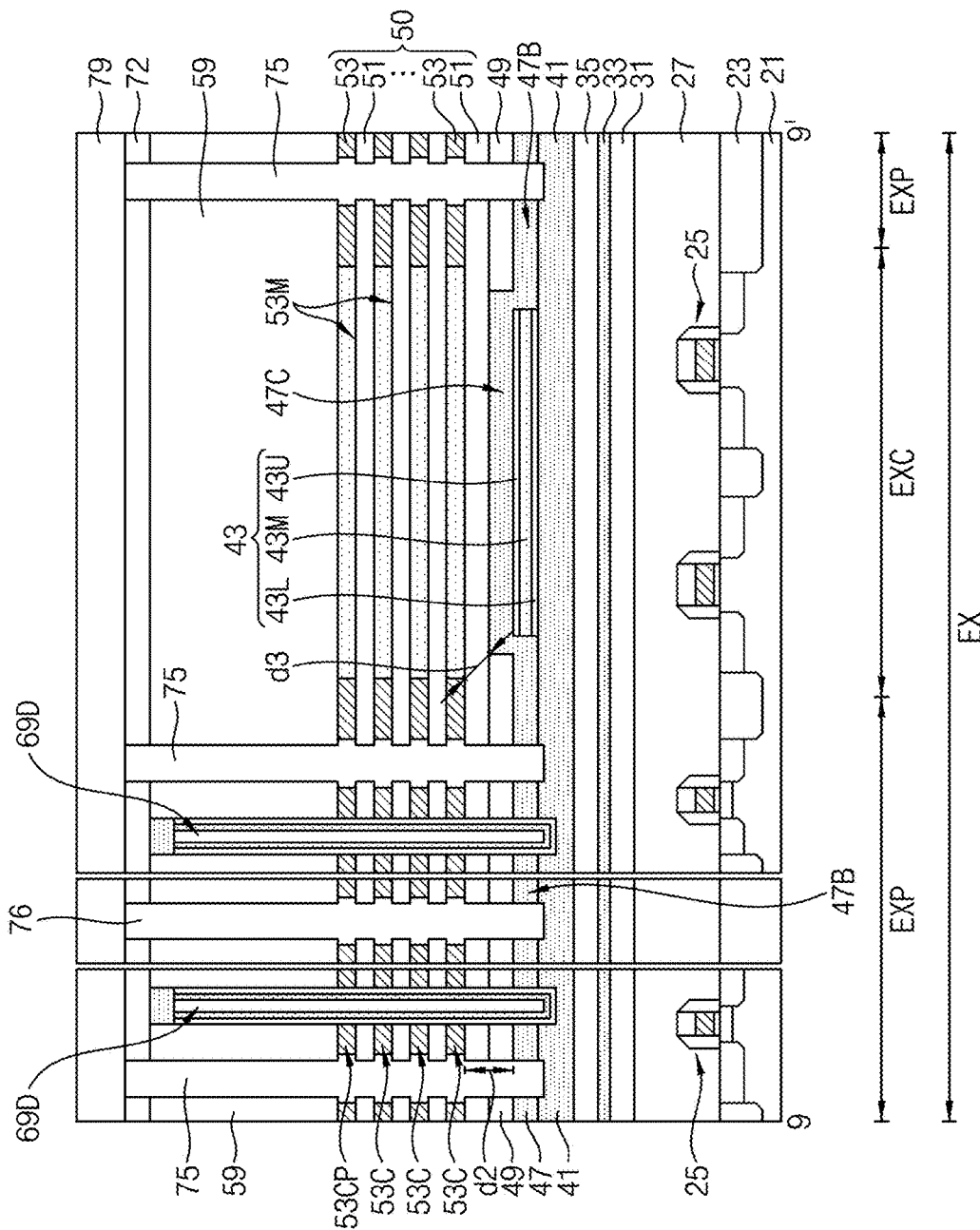

FIG. 12 is a layout for describing semiconductor devices according to example embodiments of the disclosure, and FIG. 13 is a perspective view for describing semiconductor devices. FIG. 14 is a cross-sectional view taken along lines 7-7' and 8-8' of FIG. 12, and FIG. 15 is a cross-sectional view taken along line 9-9' of FIG. 12.

Referring to FIGS. 12 to 15, a horizontal conductive layer 41 may be disposed on a substrate 21. A supporter 47 may be disposed on the horizontal conductive layer 41. A connection conductive layer 45 may be disposed between a first portion 47A of the supporter 47 and the horizontal conductive layer 41. A bottom surface of a second portion 47B of the supporter 40 may directly contact the horizontal conductive layer 41. A second buried insulation layer 49 may be disposed on the second portion 47B. In some example embodiments, the second buried insulation layer 49 may be referred to as a buried insulation layer. A connection mold layer 43 may be disposed between a third portion 47C of the supporter 47 and the horizontal conductive layer 41. A thickness of the connection mold layer 43 may be the same or substantially the same as an interval between the first portion 47A and the horizontal conductive layer 41.

A distance between an uppermost end of the second portion 47B and a top surface of the substrate 21 may be shorter than a distance between an uppermost end of the first portion 47A and the top surface of the substrate 21. Top surfaces of the first portion 47A, the second buried insulation layer 49, and the third portion 47C may be substantially coplanar. A stacked structure 50, where a plurality of insulation layers 51 and a plurality of wiring layers 53 are alternately stacked, may be disposed on the supporter 47 and the second buried insulation layer 49.

A minimum interval between the wiring layer 53 and the second portion 47B may be greater than a minimum interval between the wiring layer 53 and the first portion 47A. A minimum interval between the electrode layer 53C and the first portion 47A may be a first distance d1. A minimum interval between the electrode layer 53C and the second portion 47B may be a second distance d2. The mold layer 53M may be aligned on the third portion 47C. A minimum interval between the electrode layer 53C and the third portion 47C may be a third distance d3. The third distance d3 may be greater than the first distance d1.

A plurality of cell channel structures 69, which pass through the stacked structure 50, the first portion 47A, and the connection conductive layer 45 and extend to an inner portion of the horizontal conductive layer 41, may be disposed in a cell region CE. A plurality of dummy channel structures 69D, which pass through an interlayer insulation layer 59, the stacked structure 50, the second buried insulation layer 49, and the second portion 47B and extend to an inner portion of the horizontal conductive layer 41, may be disposed in a connection region EX.

A plurality of through electrodes 85, which pass through a second upper insulation layer 79, a first upper insulation layer 72, the interlayer insulation layer 59, the stacked structure 50, the third portion 47C, the connection mold layer 43, the horizontal conductive layer 41, a third lower insulation layer 35, a capping layer 33, and a second lower insulation layer 31 and are connected to a plurality of peripheral circuit wirings 29, may be disposed in a plurality of through electrode regions EXC.

A contact spacer 86 surrounding a side surface of each of the plurality of through electrodes 85 may be disposed. The contact spacer 86 may include silicon oxide, silicon nitride, silicon oxynitride, low-K dielectrics, high-K dielectrics, or a combination thereof. The contact spacer 86 may be interposed between the plurality of through electrodes 85 and the mold layer 53M, between the plurality of through electrodes 85 and the third portion 47C, between the plurality of through electrodes 85 and the connection mold layer 43, and between the plurality of through electrodes 85 and the horizontal conductive layer 41.

Figure 16:
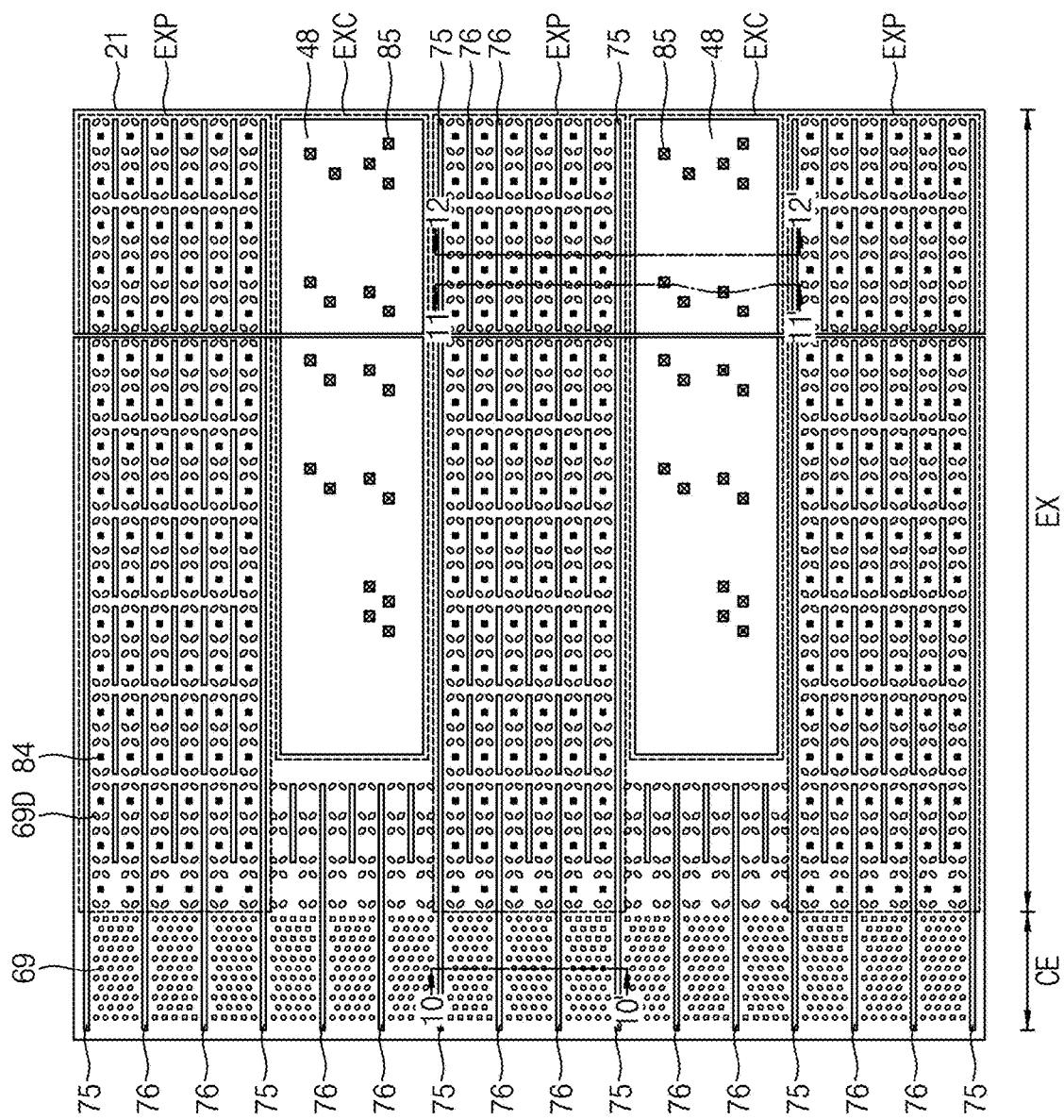
Figure 17:
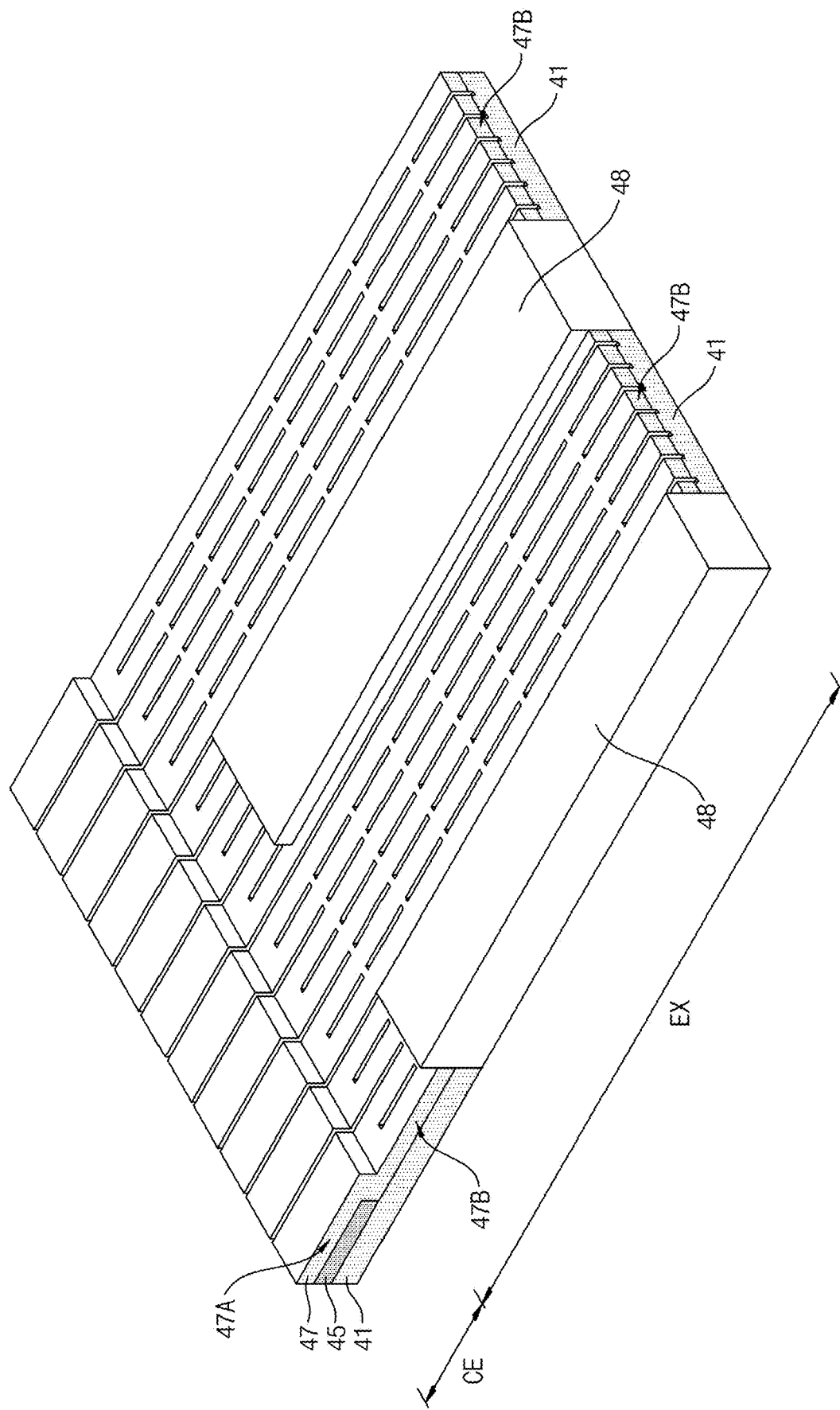
Figure 18:
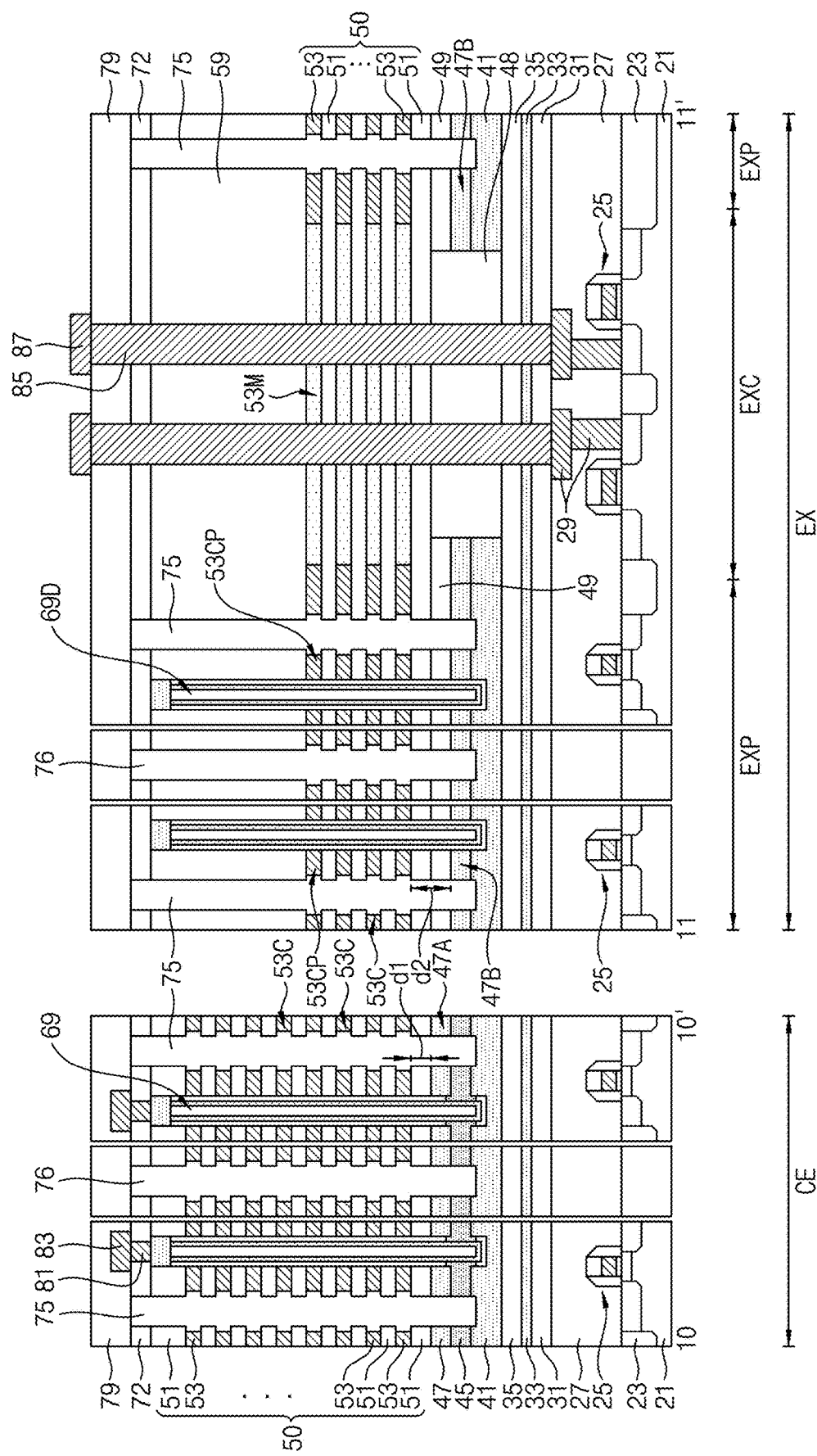
Figure 19:
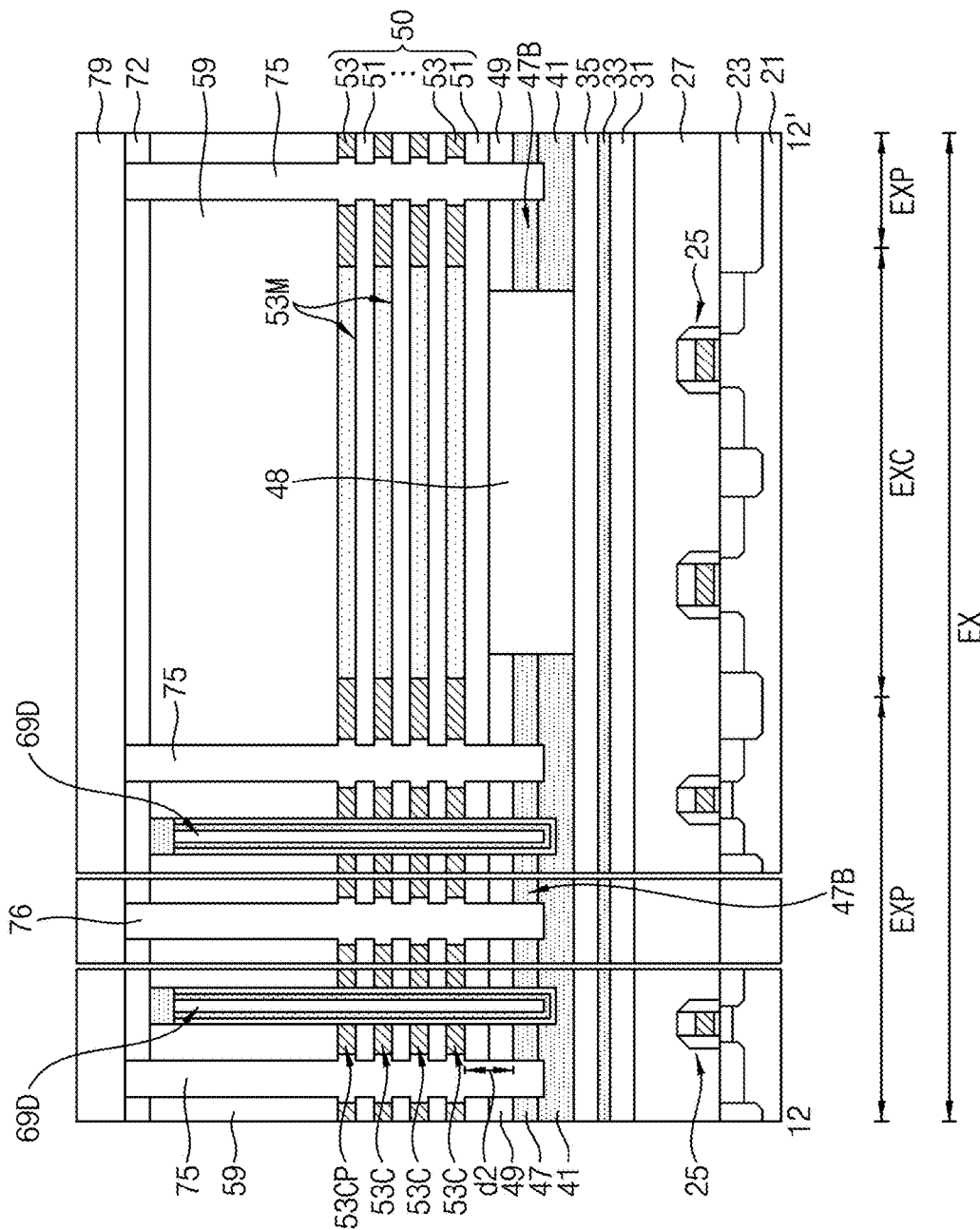

FIG. 16 is a layout for describing semiconductor devices according to example embodiments of the disclosure, and FIG. 17 is a perspective view for describing semiconductor devices. FIG. 18 is a cross-sectional view taken along lines 10-10' and 11-11' of FIG. 16, and FIG. 19 is a cross-sectional view taken along line 12-12' of FIG. 16.

Referring to FIGS. 16 to 19, a horizontal conductive layer 41 may be disposed on a substrate 21. A supporter 47 may be disposed on the horizontal conductive layer 41. The supporter 47 may include a first portion 47A and a second portion 47B. A connection conductive layer 45 may be disposed between the first portion 47A of the supporter 47 and the horizontal conductive layer 41. The first portion 47A may be disposed on the connection conductive layer 45 in a cell region CE.

The second portion 47B may connect with the first portion 47A. The second portion 47B may be disposed on the horizontal conductive layer 41 in a connection region EX. The second portion 47B may be disposed on the horizontal conductive layer 41 in a plurality of pad regions EXP. A bottom surface of the second portion 47B may directly contact a top surface of the horizontal conductive layer 41 in the plurality of pad regions EXP. A connection region between the first portion 47A and the second portion 47B may have a step. A distance between an uppermost end of the second portion 47B and a top surface of the substrate 21 may be shorter than a distance between an uppermost end of the first portion 47A and the top surface of the substrate 21.

A second buried insulation layer 49 may be disposed on the second portion 47B. A first buried insulation layer 48 passing through the second portion 47B and the horizontal conductive layer 41 may be disposed in a plurality of through electrode regions EXC. Top surfaces of the first portion 47A, the second buried insulation layer 49, and the first buried insulation layer 48 may be substantially coplanar. A stacked structure 50, where a plurality of insulation layers 51 and a plurality of wiring layers 53 are alternately stacked, may be disposed on the supporter 47, the second buried insulation layer 49, and the first buried insulation layer 48. A minimum interval between the wiring layer 53 and the second portion 47B may be greater than a minimum interval between the wiring layer 53 and the first portion 47A.

A plurality of cell channel structures 69, which pass through the stacked structure 50, the first portion 47A, and the connection conductive layer 45 and extend to an inner portion of the horizontal conductive layer 41, may be disposed in a cell region CE. A plurality of dummy channel structures 69D, which pass through an interlayer insulation layer 59, the stacked structure 50, the second buried insulation layer 49, and the second portion 47B and extend to an inner portion of the horizontal conductive layer 41, may be disposed in a connection region EX.

A plurality of through electrodes 85, which pass through a second upper insulation layer 79, a first upper insulation layer 72, the interlayer insulation layer 59, the stacked structure 50, the first buried insulation layer 48, a third lower insulation layer 35, a capping layer 33, and a second lower insulation layer 31 and are connected to a plurality of peripheral circuit wirings 29, may be disposed in a plurality of through electrode regions EXC.

Figure 20:
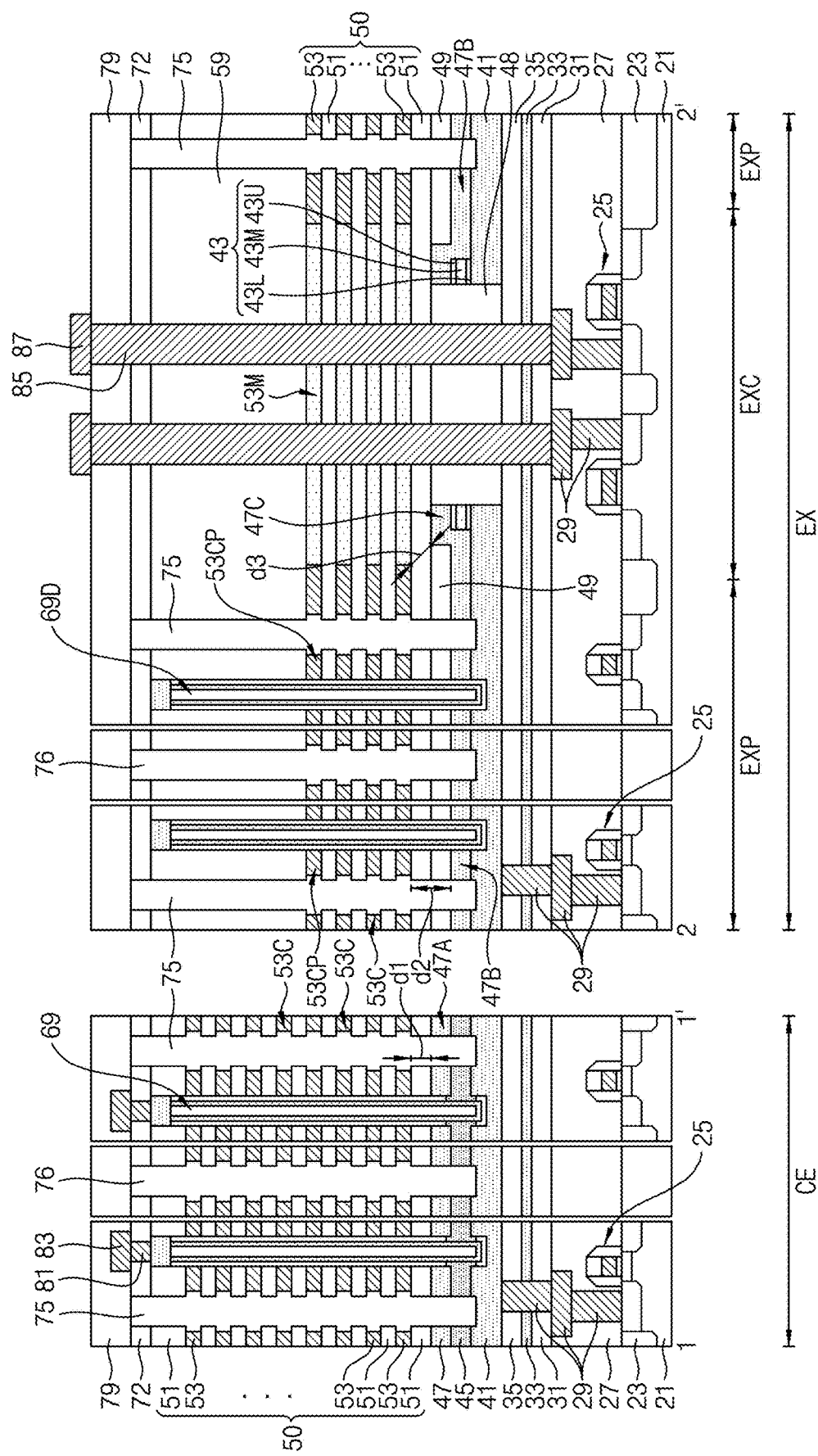
Figure 21:
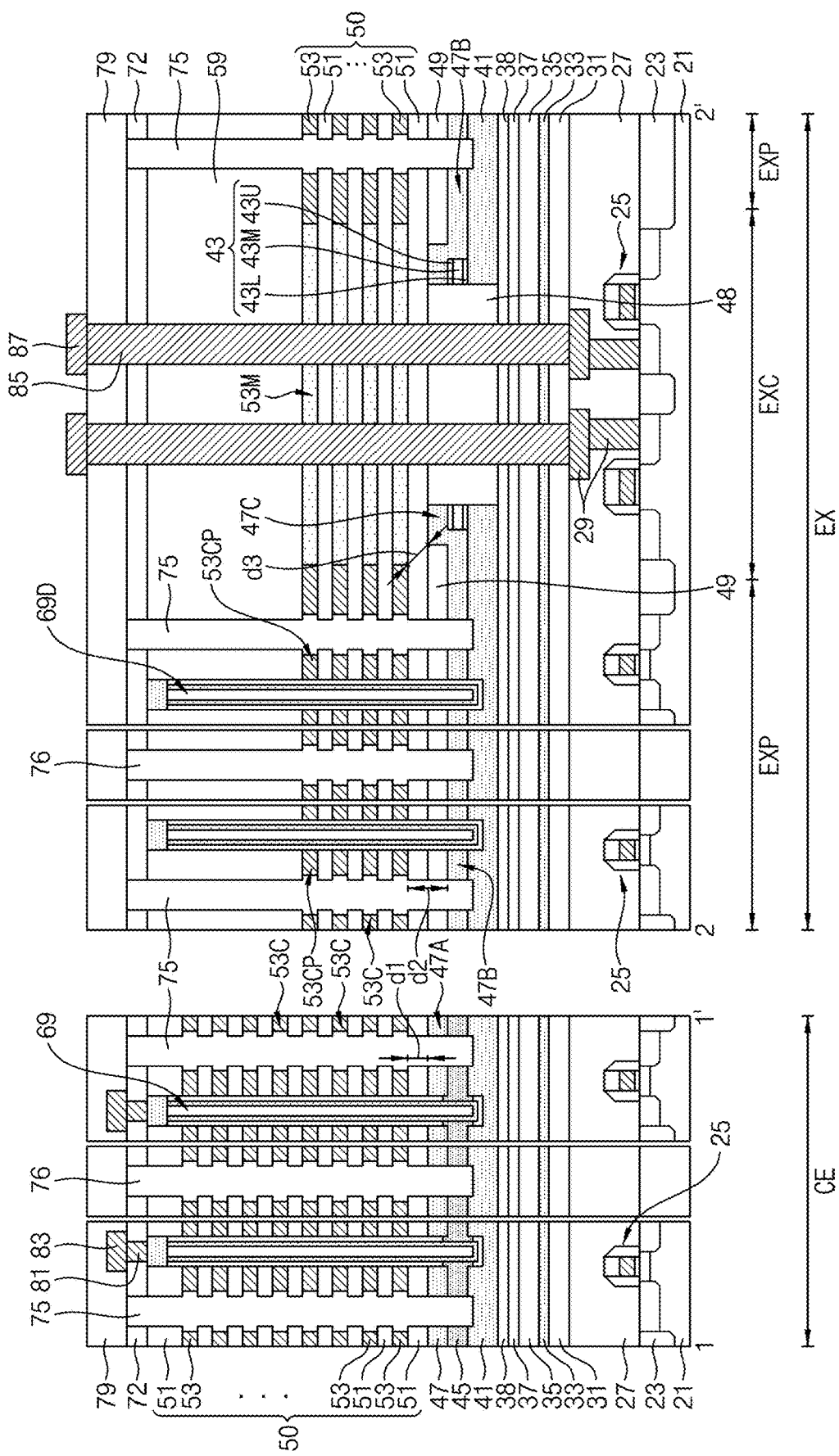

FIGS. 20 and 21 are cross-sectional views taken along lines 1-1' and 2-2' of FIG. 3, for describing semiconductor devices according to example embodiments of the disclosure.

Referring to FIG. 20, a horizontal conductive layer 41 may be connected to a plurality of transistors 25 via some corresponding peripheral circuit wirings among a plurality of peripheral circuit wirings 29. Some of the plurality of peripheral circuit wirings 29 may extend to an inner portion of each of a first lower insulation layer 27, a second lower insulation layer 31, a capping layer 33, and a third lower insulation layer 35 and may contact a bottom surface of the horizontal conductive layer 41.

Referring to FIG. 21, semiconductor devices according to example embodiments of the disclosure may be formed by using wafer bonding technology. For example, a first bonding layer 37 and a second bonding layer 38 may be disposed between a third lower insulation layer 35 and a horizontal conductive layer 41. The first bonding layer 37 and the second bonding layer 38 may extend to a portion between the third lower insulation layer 35 and a first buried insulation layer 48. A plurality of through electrodes 85, which pass through a second upper insulation layer 79, a first upper insulation layer 72, an interlayer insulation layer 59, a stacked structure 50, the first buried insulation layer 48, the second bonding layer 38, the first bonding layer 37, the third lower insulation layer 35, a capping layer 33, and a second lower insulation layer 31 and are connected to a plurality of peripheral circuit wirings 29, may be disposed in a through electrode region EXC.

The first bonding layer 37 may be formed on the third lower insulation layer 35. The second bonding layer 38 may be disposed on a bottom surface of the horizontal conductive layer 41. The second bonding layer 38 may contact the first bonding layer 37. Each of the first bonding layer 37 and the second bonding layer 38 may include silicon oxide, silicon nitride, silicon oxynitride, low-K dielectrics, high-K dielectrics, or a combination thereof.

FIGS. 22, 24, 26, 28, 30, 32, 34, 36, and 38 are cross-sectional views taken along lines 1-1' and 2-2' of FIG. 3, for describing methods of manufacturing semiconductor devices according to an embodiment of the disclosure, and FIGS. 23, 25, 27, 29, 31, 33, 35, and 37 are cross-sectional views taken along line 3-3' of FIG. 3, for describing methods of manufacturing semiconductor devices.

Figure 22:
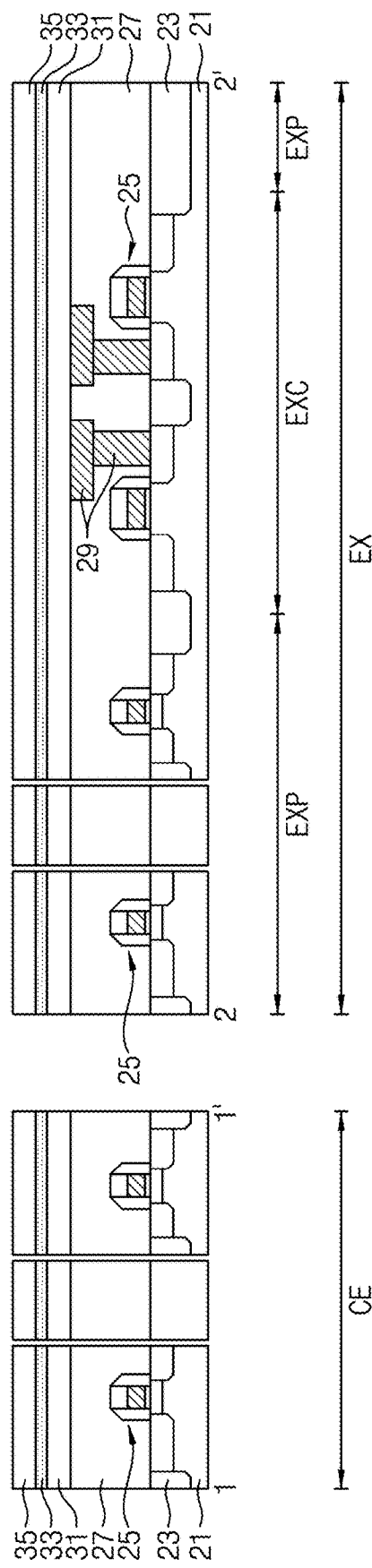
FIGS. 22 to 40 are cross-sectional views for describing methods of manufacturing semiconductor devices according to example embodiments of the disclosure.
Figure 23:
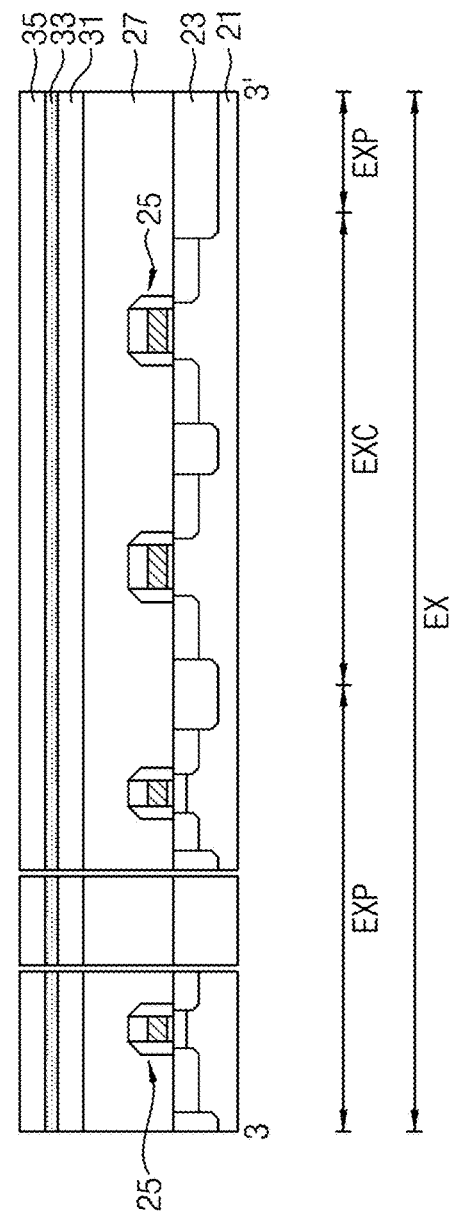

Referring to FIGS. 3, 22, and 23, an isolation layer 23, a plurality of transistors 25, a first lower insulation layer 27, a plurality of peripheral circuit wirings 29, a second lower insulation layer 31, a capping layer 33, and a third lower insulation layer 35 may be formed on a substrate 21.

The substrate 21 may include a semiconductor substrate such as a silicon wafer. Each of the isolation layer 23, the first lower insulation layer 27, the second lower insulation layer 31, and the third lower insulation layer 35 may include a compound including silicon (Si) and oxide (O), a compound including Si and nitride (N), silicon oxide, silicon nitride, silicon oxynitride, low-K dielectrics, high-K dielectrics, or a combination thereof. The isolation layer 23 may include an insulation layer which is formed by using a shallow trench isolation (STI) method. The capping layer 33 may include a material which differs from that of each of the second lower insulation layer 31 and the third lower insulation layer 35. In some example embodiments, the capping layer 33 may include a compound including Si and N, silicon nitride, silicon oxynitride, silicon boron nitride (SiBN), silicon carbon nitride (SiCN), or a combination thereof. A top surface of the third lower insulation layer 35 may be planarized.

The plurality of transistors 25 may be formed in/on the substrate 21 by various methods. The plurality of transistors may include a fin field effect transistor (finFET), a multi-bridge channel (MBC) transistor, a nano-wire transistor, a vertical transistor, a recess channel transistor, a 3D transistor, a planar transistor, or a combination thereof.

The first lower insulation layer 27 may cover the isolation layer 23 and the plurality of transistors 25. The second lower insulation layer 31, the capping layer 33, and the third lower insulation layer 35 may be sequentially formed on the first lower insulation layer 27. The plurality of peripheral circuit wirings 29 may be formed in the first lower insulation layer 27. The plurality of peripheral circuit wirings 29 may each include metal, metal nitride, metal silicide, metal oxide, conductive carbon, polysilicon, or a combination thereof. The plurality of peripheral circuit wirings 29 may be connected to the plurality of transistors 25. The plurality of peripheral circuit wirings 29 may include a horizontal wiring and a vertical wiring each having various shapes. The plurality of transistors 25 and the plurality of peripheral circuit wirings 29 may configure a peripheral circuit.

Figure 24:
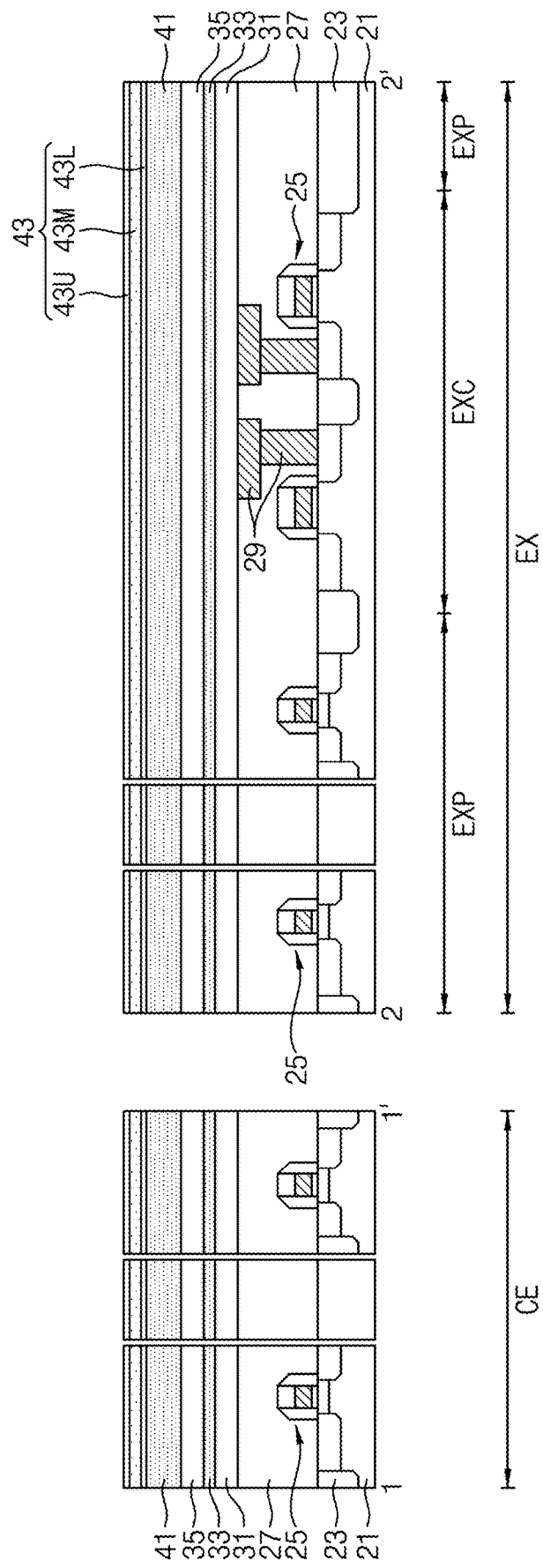
Figure 25:
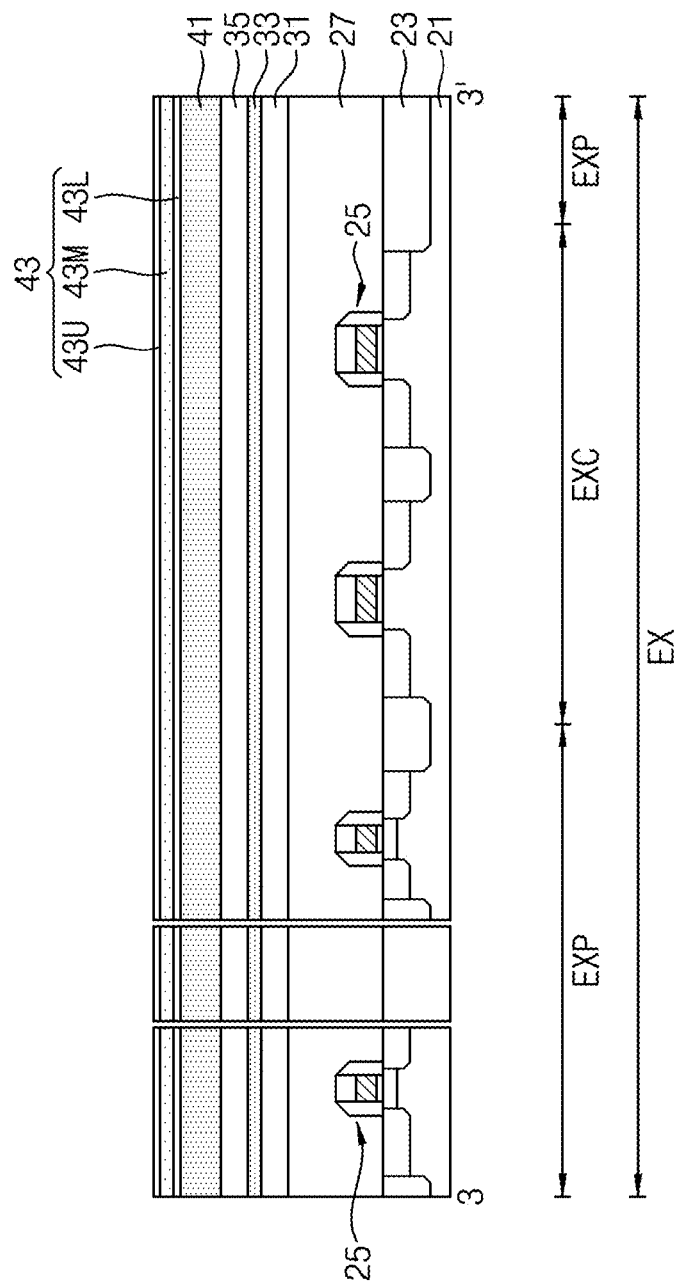

Referring to FIGS. 3, 24, and 25, a horizontal conductive layer 41 may be formed on the third lower insulation layer 35. A connection mold layer 43 may be formed on the horizontal conductive layer 41.

The horizontal conductive layer 41 may include metal, metal nitride, metal silicide, metal oxide, conductive carbon, polysilicon, or a combination thereof. In some example embodiments, the horizontal conductive layer 41 may include a doped polysilicon layer. The horizontal conductive layer 41 may be a single layer or a multilayer. The horizontal conductive layer 41 may include a polysilicon layer, a tungsten silicon (WSi) layer, a tungsten (W) layer, a cobalt silicon (CoSi) layer, a nickel silicon (NiSi) layer, a titanium (Ti) layer, a titanium nitride (TiN) layer, a titanium silicon (TiSi) layer, a tantalum (Ta) layer, a tantalum nitride (TaN) layer, a tantalum silicon (TaSi) layer, or a combination thereof.

The connection mold layer 43 may include a material having an etch selectivity with respect to the horizontal conductive layer 41. The connection mold layer 43 may include a lower mold layer 43L, a middle mold layer 43M, and an upper mold layer 43U which are sequentially stacked. Each of the lower mold layer 43L and the upper mold layer 43U may be thinner than the middle mold layer 43M. In some example embodiments, the lower mold layer 43L and the upper mold layer 43U may include a compound (for example, silicon oxide) including Si and O, and the middle mold layer 43M may include a compound (for example, silicon nitride) including Si and N.

Figure 26:
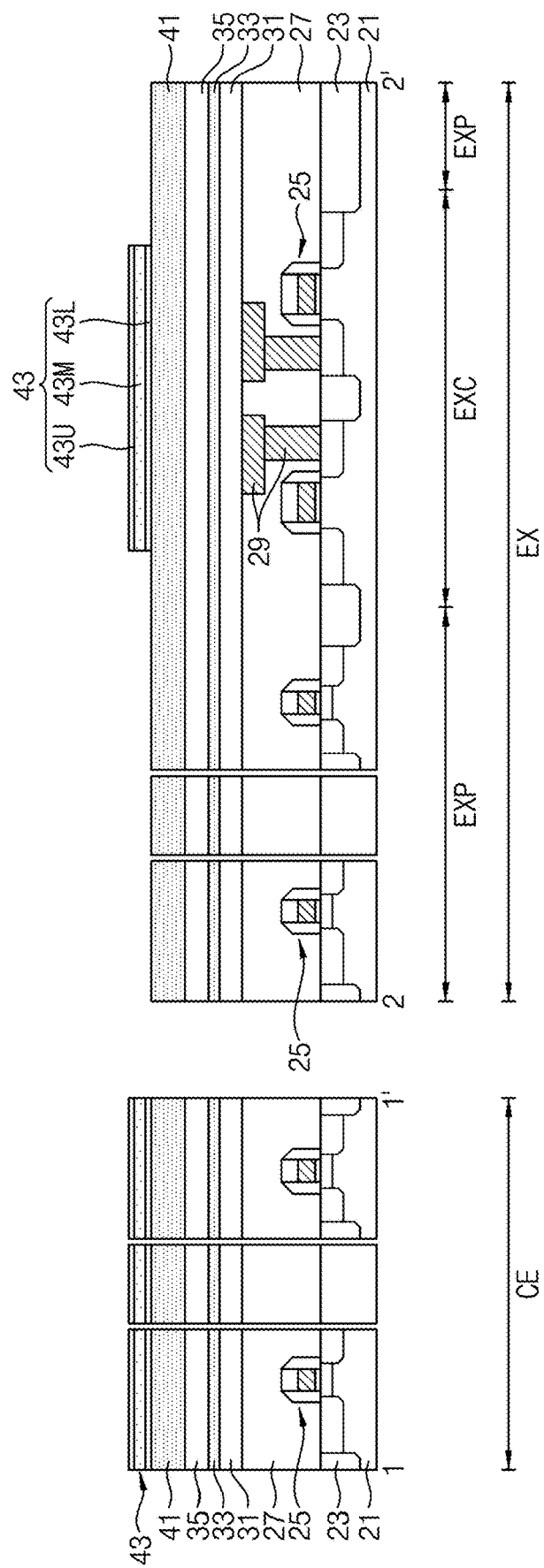
Figure 27:
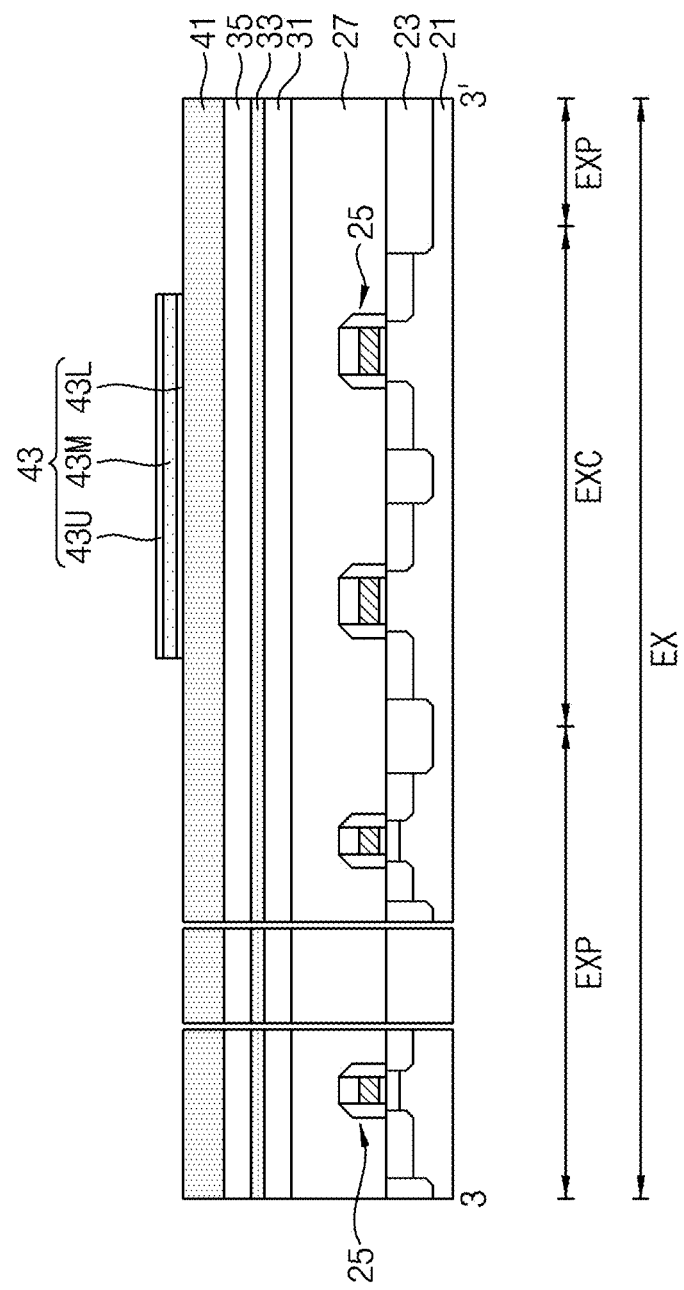

Referring to FIGS. 2, 26, and 27, a top surface of the horizontal conductive layer 41 may be exposed in a plurality of pad regions EXP by partially removing the connection mold layer 43 by using a patterning process. The connection mold layer 43 may remain on the horizontal conductive layer 41 in a cell region CE and a through electrode region EXC.

Figure 28:
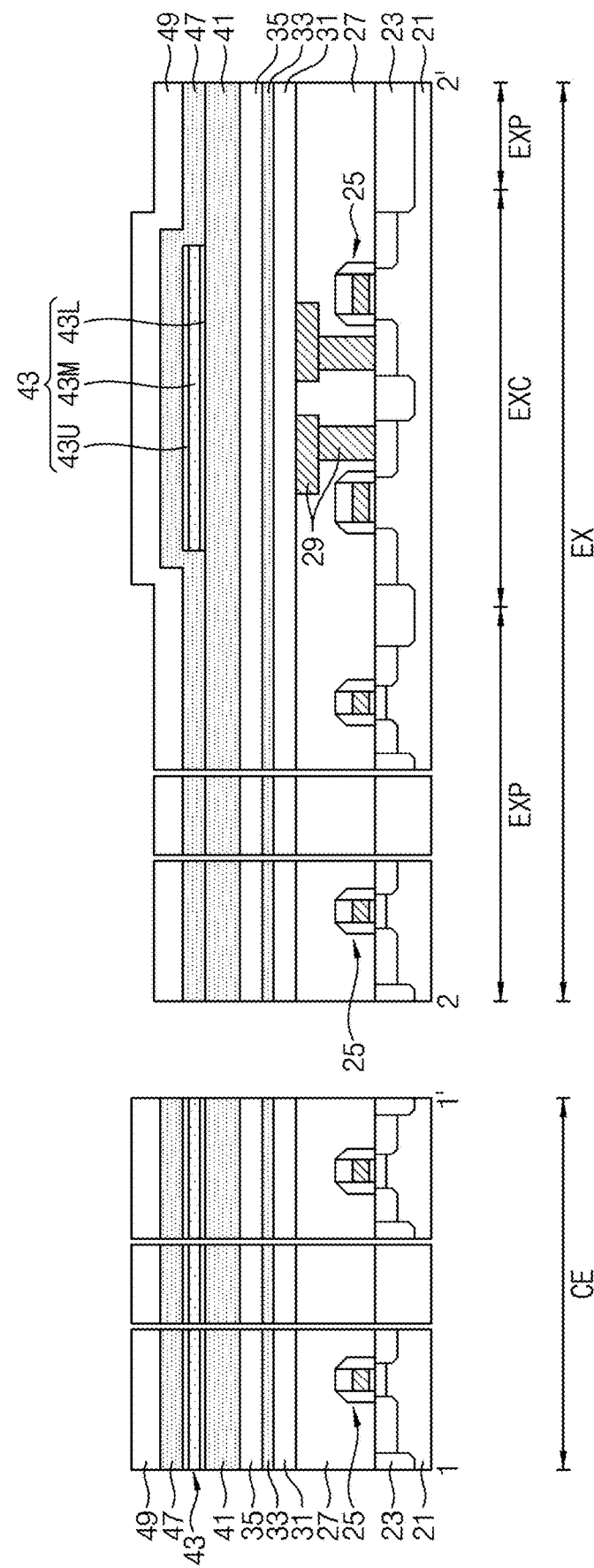
Figure 29:
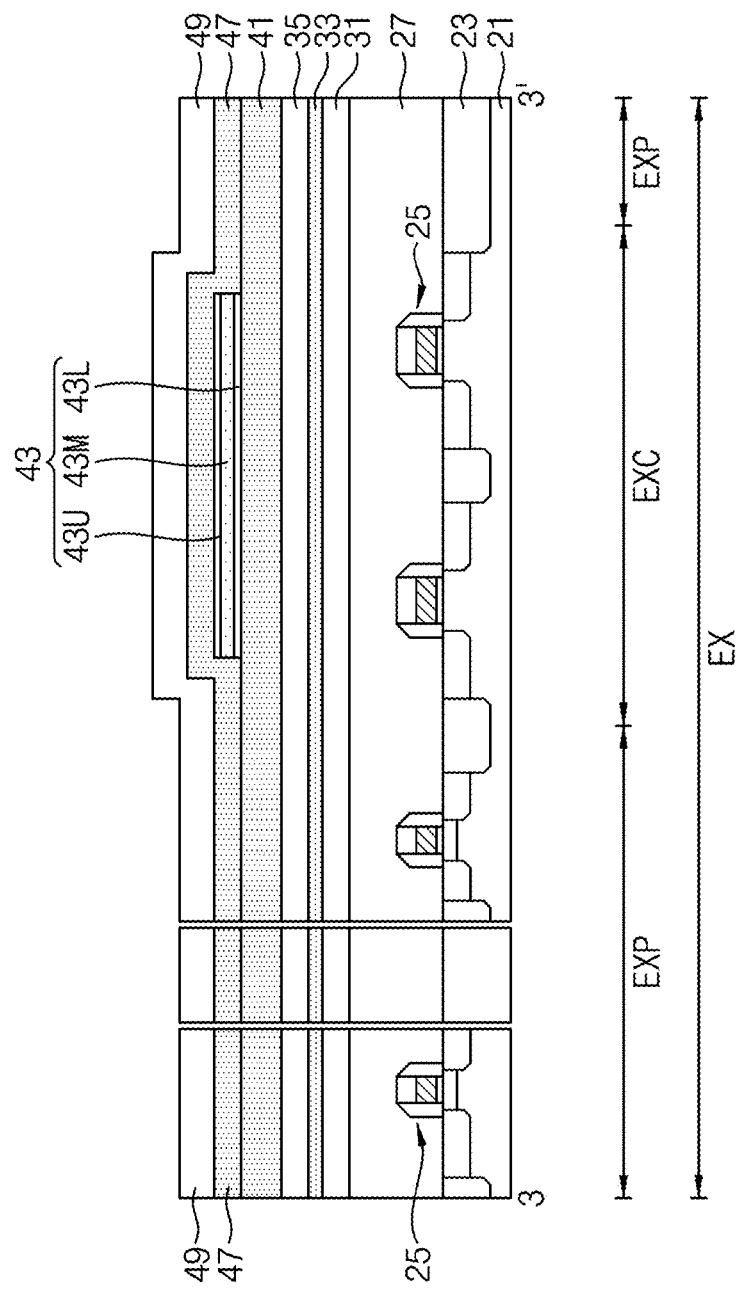

Referring to FIGS. 3, 28, and 29, a supporter 47 may be formed on the horizontal conductive layer 41 and the connection mold layer 43. The supporter 47 may directly contact a top surface and a side surface of the connection mold layer 43. The supporter 47 may directly contact a top surface of the horizontal conductive layer 41 in the plurality of pad regions EXP. A second buried insulation layer 49 may be formed on the supporter 47.

The supporter 47 may include a material having an etch selectivity with respect to the connection mold layer 43. For example, the supporter 47 may include a polysilicon layer. The second buried insulation layer 49 may include a compound (for example, silicon oxide) including Si and O, a compound (for example, silicon nitride) including Si and N, silicon oxide, silicon nitride, silicon oxynitride, low-K dielectrics, high-K dielectrics, or a combination thereof. For example, the second buried insulation layer 49 may include a silicon oxide layer.

Figure 30:
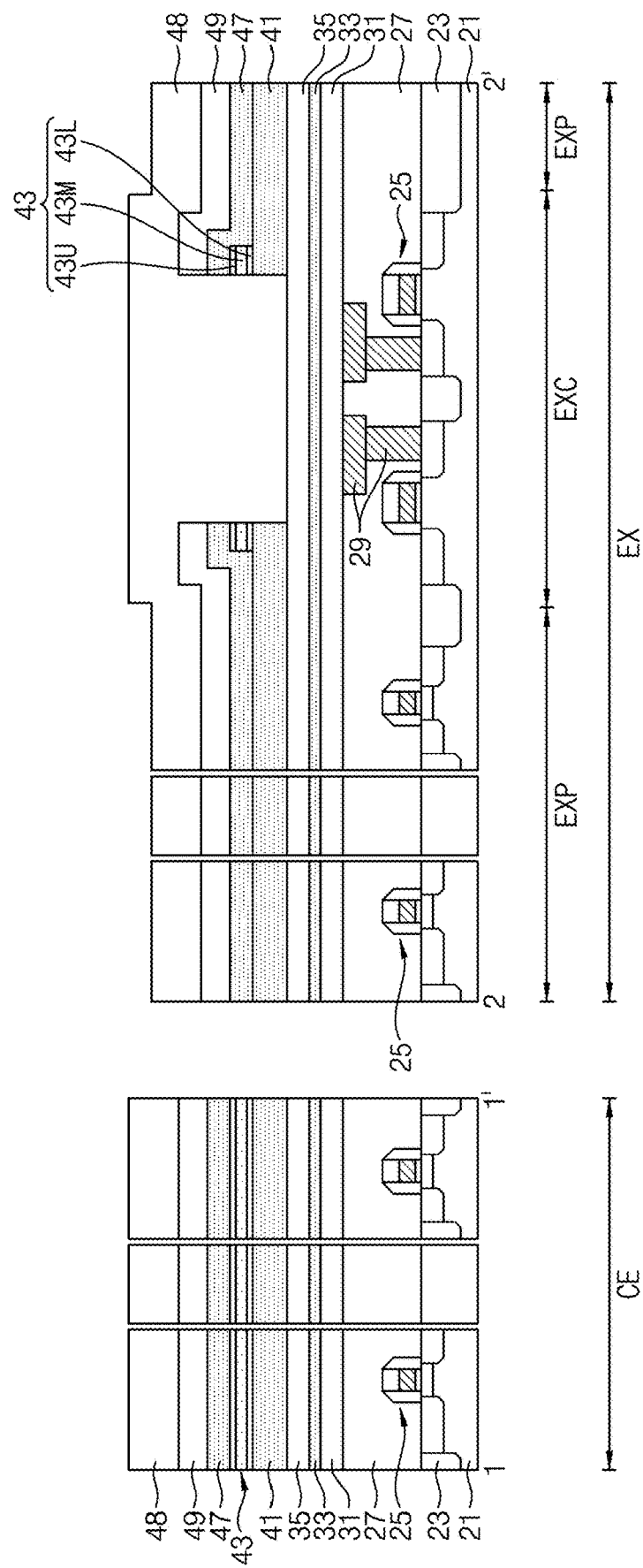
Figure 31:
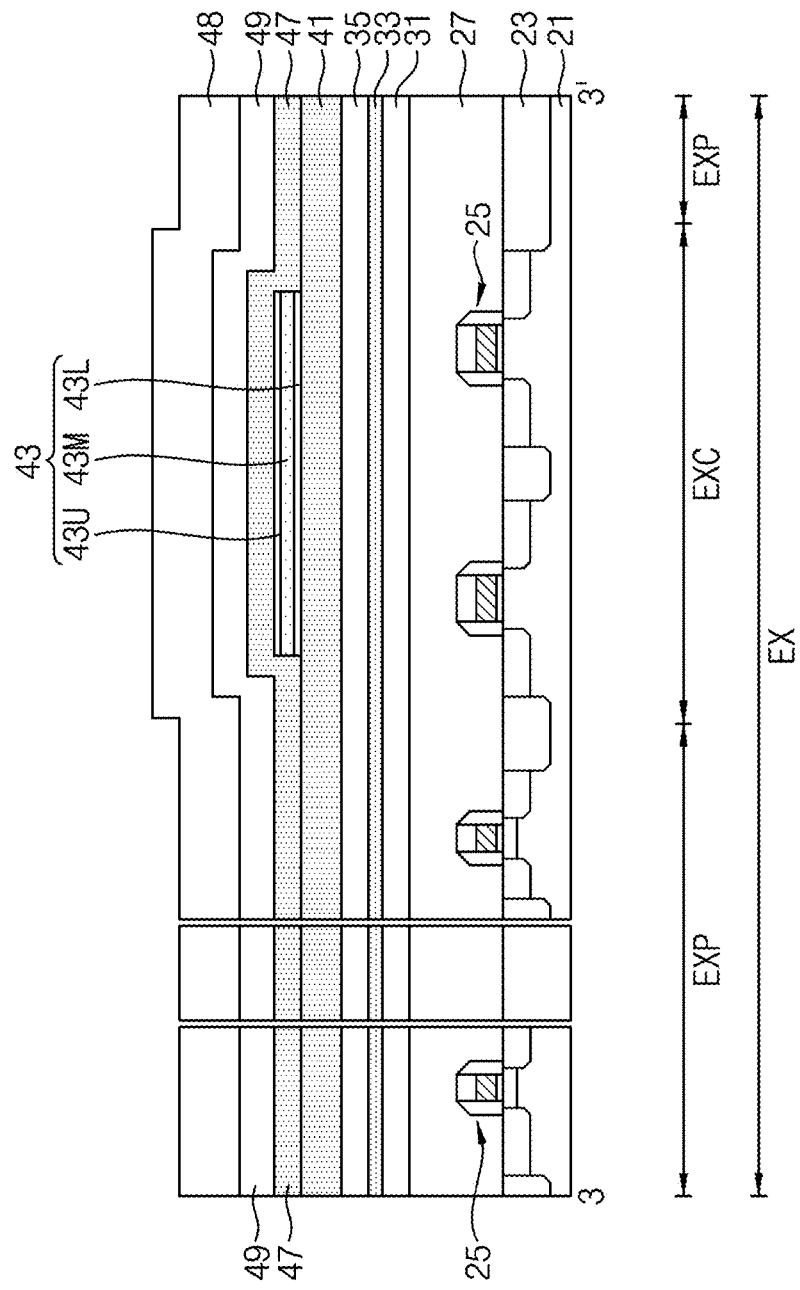

Referring to FIGS. 3, 30, and 31, a first buried insulation layer 48 may be formed on the second buried insulation layer 49. The first buried insulation layer 48 may extend to an inner portion of each of the second buried insulation layer 49, the supporter 47, the connection mold layer 43, and the horizontal conductive layer 41, in the through electrode region EXC. The first buried insulation layer 48 may fully pass through the second buried insulation layer 49, the supporter 47, the connection mold layer 43, and the horizontal conductive layer 41 and may directly contact the third lower insulation layer 35, in the through electrode region EXC. The first buried insulation layer 48 may include a compound including Si and O, a compound including Si and N, silicon oxide, silicon nitride, silicon oxynitride, low-K dielectrics, high-K dielectrics, or a combination thereof. For example, the first buried insulation layer 48 may include a silicon oxide layer.

Figure 32:
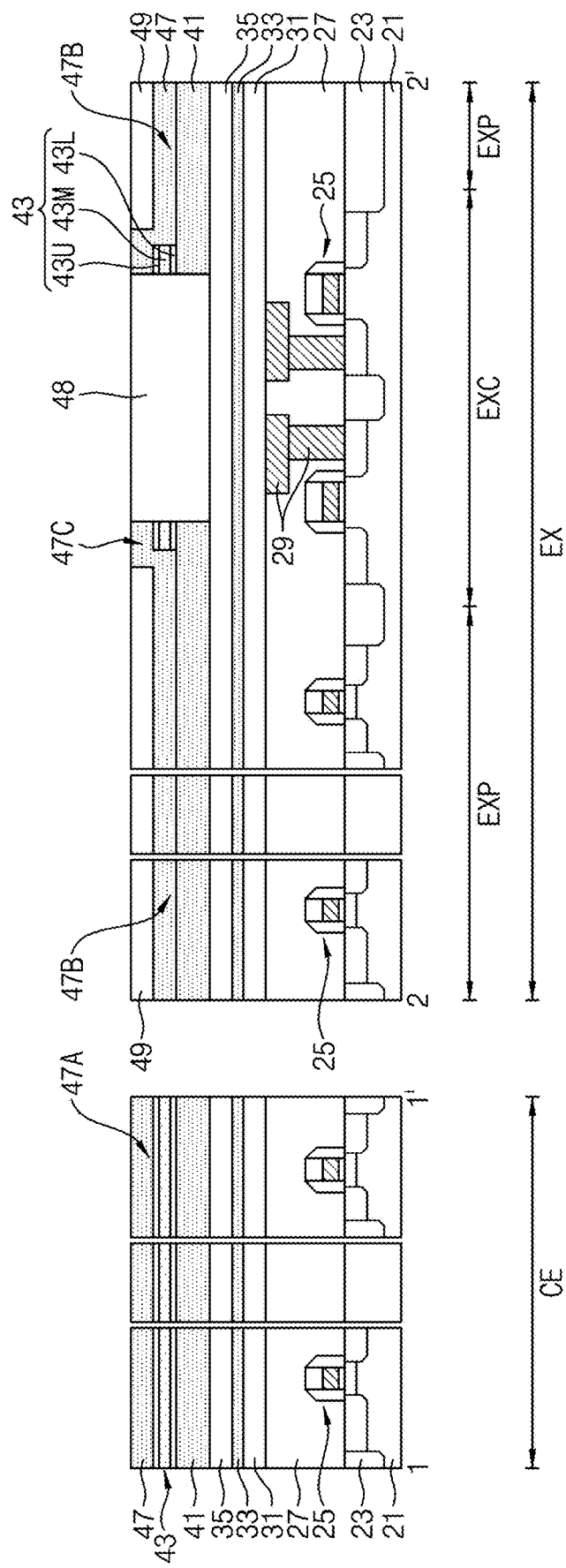
Figure 33:
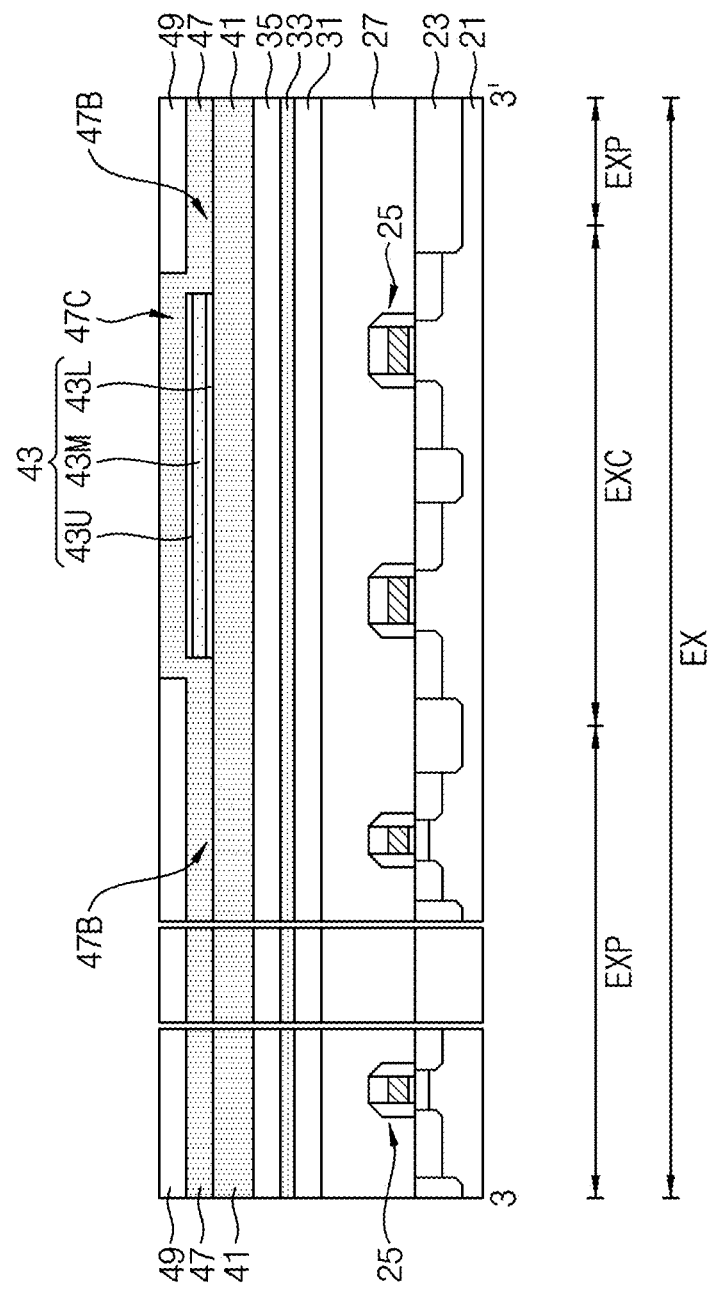

Referring to FIGS. 3, 32, and 33, a top surface of the supporter 47 may be partially exposed by planarizing the first buried insulation layer 48 and the second buried insulation layer 49. A chemical mechanical polishing (CMP) process, an etch-back process, or a combination thereof may be applied to the planarization of the first buried insulation layer 48 and the second buried insulation layer 49.

The supporter 47 may include a first portion 47A in the cell region CE, a second portion 47B in the plurality of pad regions EXP, and a third portion 47C in the through electrode region EXC. The first buried insulation layer 48 may remain in the through electrode region EXC. The first buried insulation layer 48 may extend to an inner portion of each of the third portion 47C, the connection mold layer 43, and the horizontal conductive layer 41. The first buried insulation layer 48 may fully pass through the third portion 47C, the connection mold layer 43, and the horizontal conductive layer 41 and may directly contact the third lower insulation layer 35. The second buried insulation layer 49 may cover the second portion 47B. Top surfaces of the first portion 47A, the second buried insulation layer 49, the third portion 47C, and the first buried insulation layer 48 may be exposed at the same or substantially the same plane.

The third portion 47C of the supporter 47 may perform a function of enabling top surfaces of the first portion 47A, the second buried insulation layer 49, the third portion 47C, and the first buried insulation layer 48 to maintain a coplanar surface while a planarization process is being performed.

Figure 34:
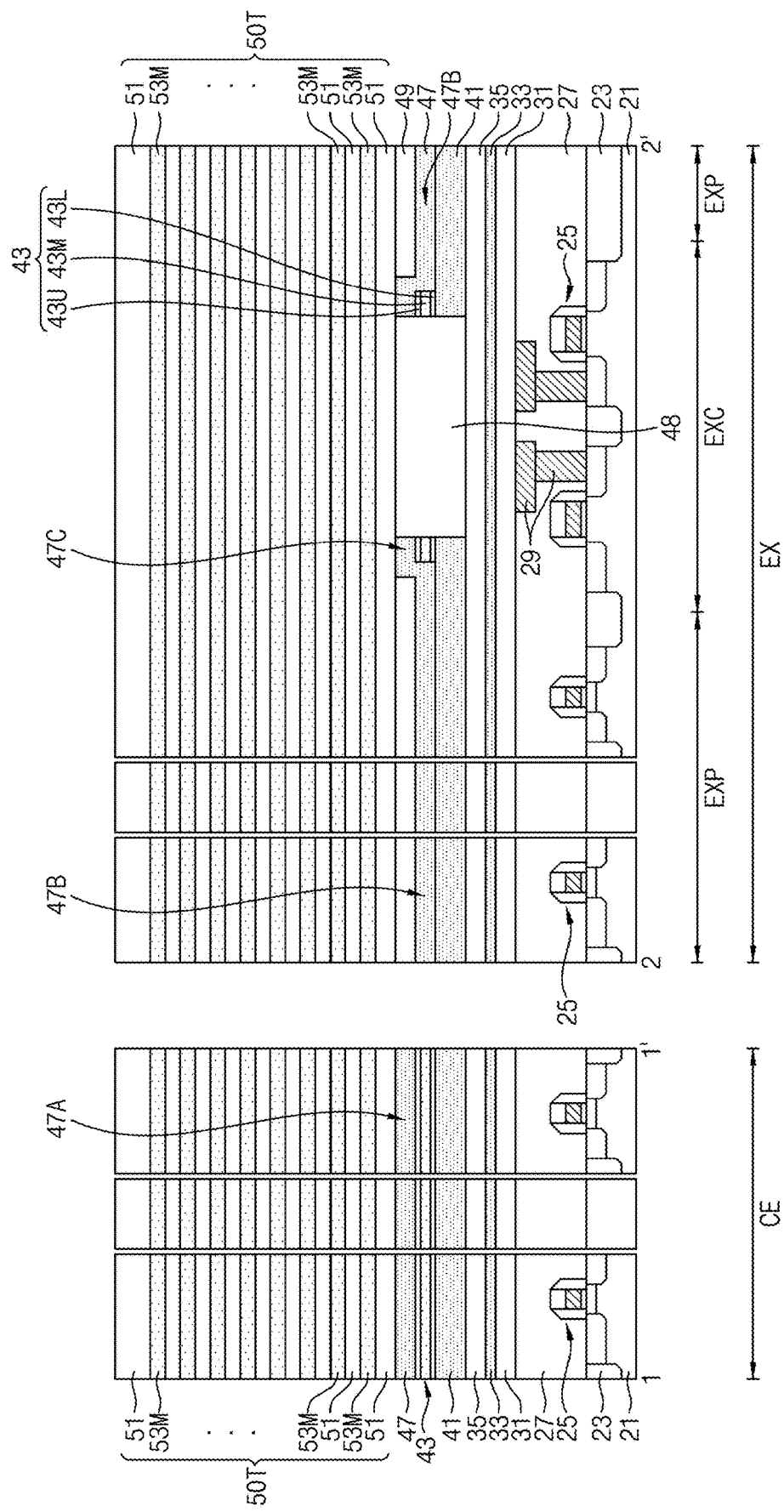
Figure 35:
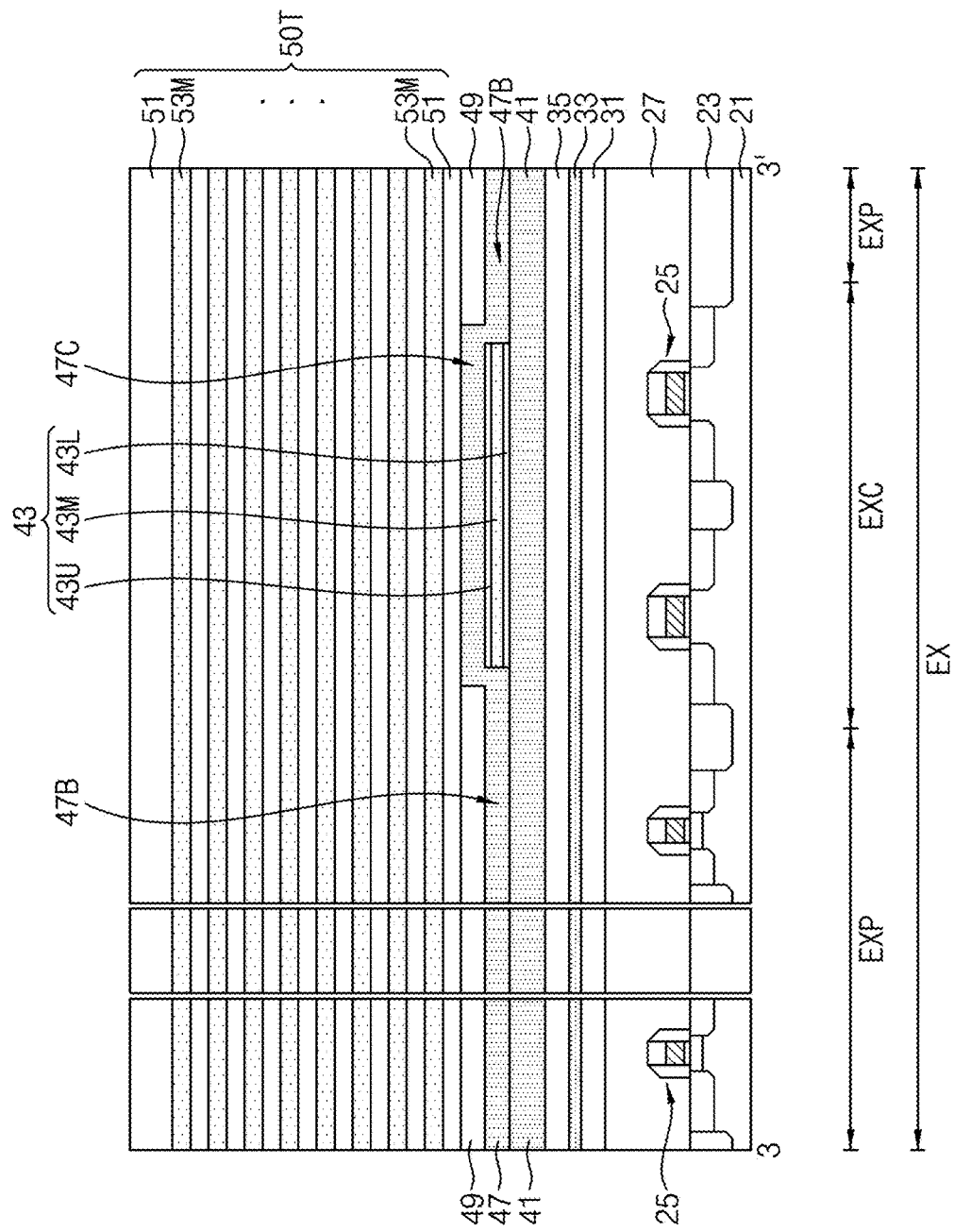

Referring to FIGS. 3, 34, and 35, a preliminary stacked structure 50T may be formed on the first portion 47A, the second buried insulation layer 49, the third portion 47C, and the first buried insulation layer 48. The preliminary stacked structure 50T may include a plurality of insulation layers 51 and a plurality of mold layers 53M, which are alternately and repeatedly stacked. The plurality of mold layers 53M may include a material having an etch selectivity with respect to the plurality of insulation layers 51. In some example embodiments, the plurality of insulation layers 51 may include a compound (for example, silicon oxide) layer including Si and O, and the plurality of mold layers 53M may include a compound (for example, silicon nitride) layer including Si and N.

Figure 36:
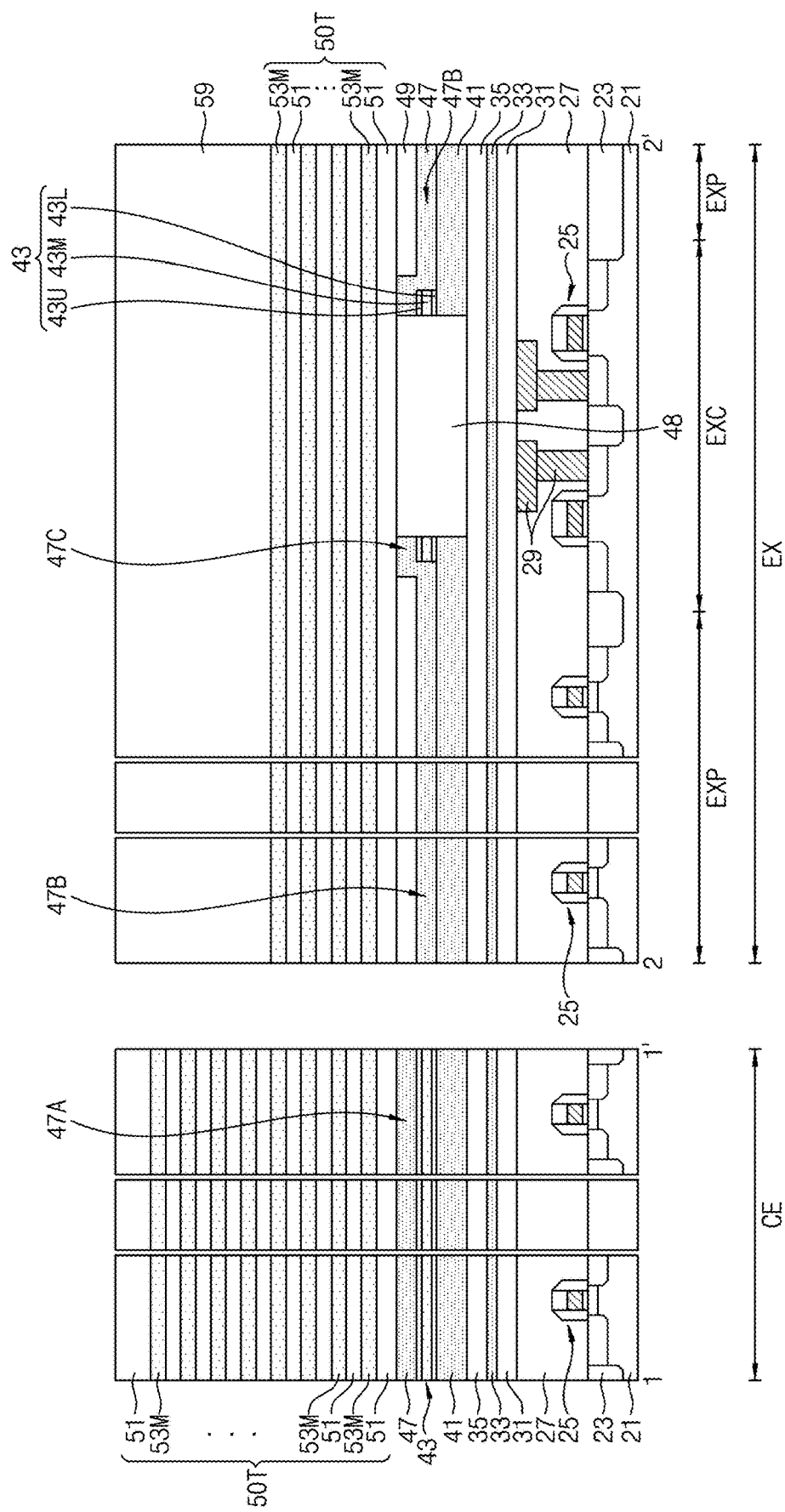
Figure 37:
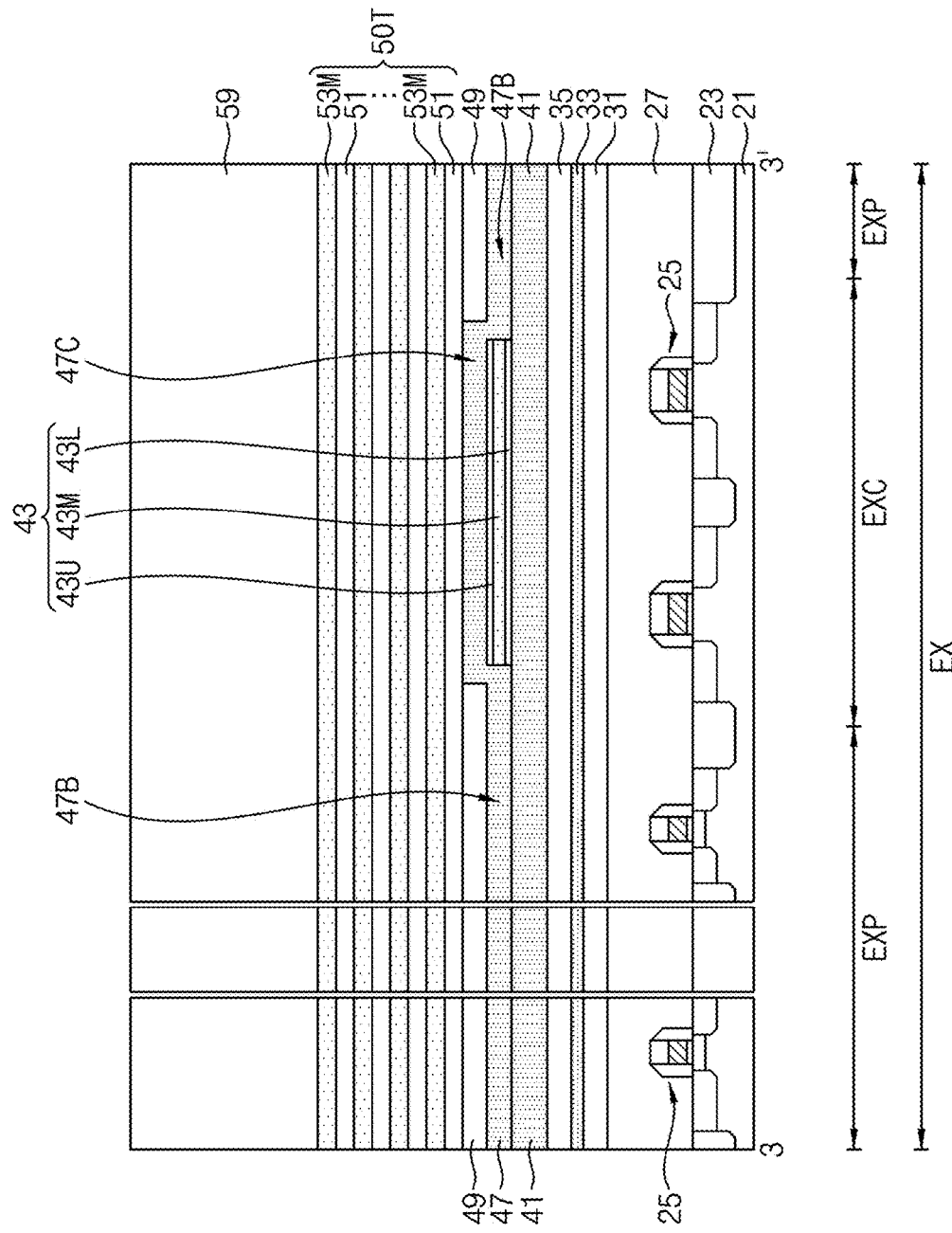

Referring to FIGS. 3, 36, and 37, the preliminary stacked structure 50T may be partially removed, and an interlayer insulation layer 59 may be formed. The interlayer insulation layer 59 may cover the preliminary stacked structure 50T in a connection region EX. The interlayer insulation layer 59 may include a compound including Si and O, a compound including Si and N, silicon oxide, silicon nitride, silicon oxynitride, low-K dielectrics, high-K dielectrics, or a combination thereof. For example, the interlayer insulation layer 59 may include a silicon oxide layer.

Figure 38:
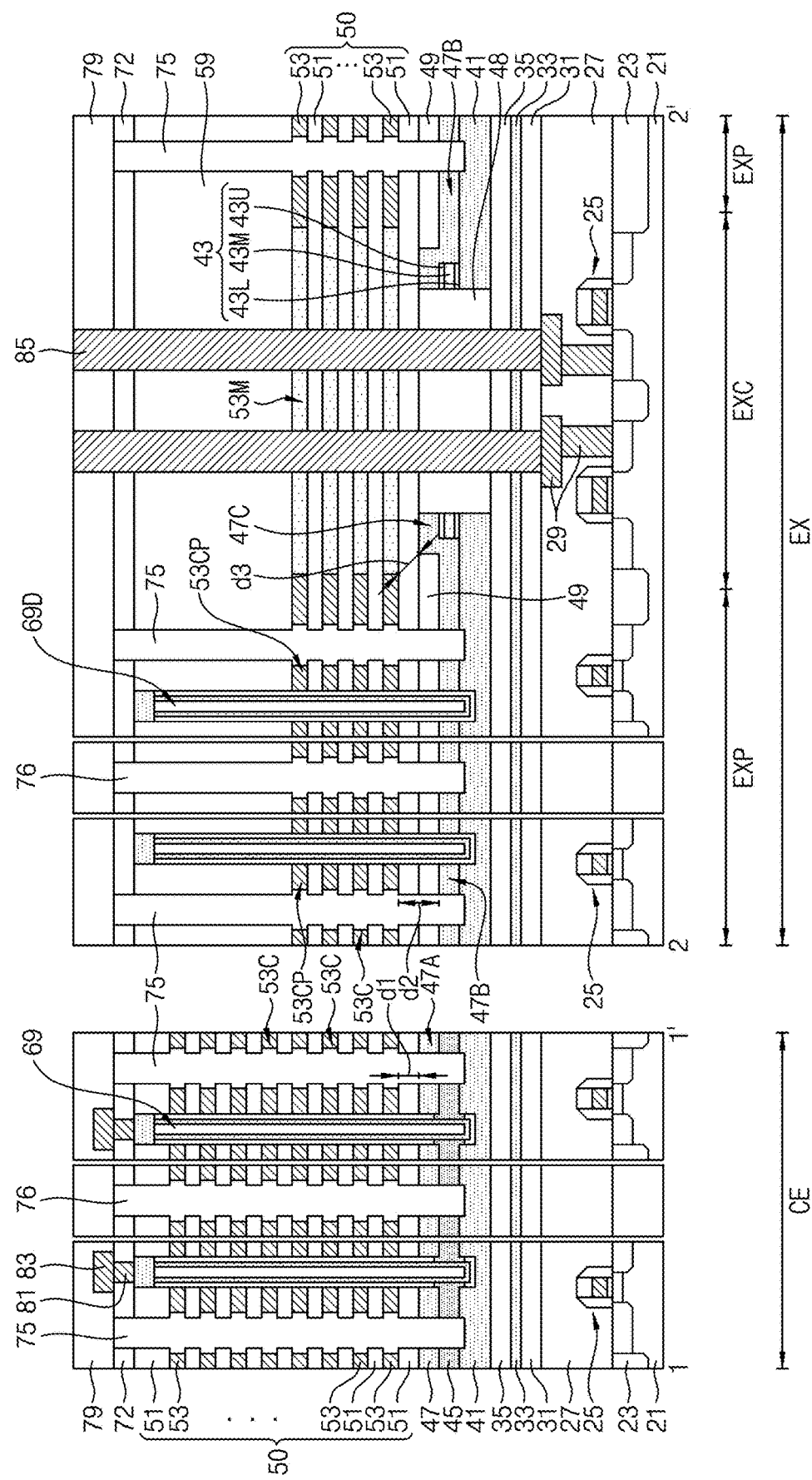

Referring to FIGS. 2, 3, and 38, a plurality of cell channel structures 69 and a plurality of dummy channel structures 69D each passing through the preliminary stacked structure 50T may be formed. Each of the plurality of cell channel structures 69 may be disposed in the cell region CE. Each of the plurality of cell channel structures 69 may pass through the preliminary stacked structure 50T, the first portion 47A, and the connection mold layer 43 and may extend to an inner portion of the horizontal conductive layer 41. Each of the plurality of cell channel structures 69 may include a configuration illustrated in FIGS. 5 and 7. Each of the plurality of dummy channel structures 69D may be disposed in the connection region EX. Each of the plurality of dummy channel structures 69D may pass through the interlayer insulation layer 59, the preliminary stacked structure 50T, the second buried insulation layer 49, and the second portion 47B and may extend to an inner portion of the horizontal conductive layer 41. Each of the plurality of dummy channel structures 69D may include a configuration illustrated in FIG. 6.

A first upper insulation layer 72 may be formed on the preliminary stacked structure 50T, the plurality of cell channel structures 69, the plurality of dummy channel structures 69D, and the interlayer insulation layer 59. The connection mold layer 43 in the cell region CE may be removed, and a connection conductive layer 45 may be formed. The connection conductive layer 45 may be formed between the first portion 47A and the horizontal conductive layer 41 in the cell region CE. The connection conductive layer 45 may include metal, metal nitride, metal silicide, metal oxide, conductive carbon, polysilicon, or a combination thereof. For example, the connection conductive layer 45 may include a doped polysilicon layer. As illustrated in FIG. 7, the connection conductive layer 45 may pass through the information storage pattern 66 and may directly contact a side surface of the channel layer 62. The connection mold layer 43 may locally remain in the through electrode region EXC.

The plurality of mold layers 53M may be partially removed, and a plurality of electrode layers 53C may be formed. The plurality of mold layers 53M may remain in the through electrode region EXC. The plurality of electrode layers 53C and the plurality of mold layers 53M may configure a plurality of wiring layers 53. The plurality of insulation layers 51 and the plurality of wiring layers 53 may configure a stacked structure 50. Each of the plurality of electrode layers 53C may include metal, metal nitride, metal silicide, metal oxide, conductive carbon, polysilicon, or a combination thereof.

A plurality of separation patterns 75 and a plurality of middle separation patterns 76 each crossing the stacked structure 50 may be formed. The plurality of middle separation patterns 76 may be formed between the plurality of separation patterns 75. The plurality of separation patterns 75 and the plurality of middle separation patterns 76 may each include a compound including Si and O, a compound including Si and N, silicon oxide, silicon nitride, silicon oxynitride, low-K dielectrics, high-K dielectrics, or a combination thereof. For example, the plurality of separation patterns 75 and the plurality of middle separation patterns 76 may each include a silicon oxide layer.

Each of the plurality of separation patterns 75 and the plurality of middle separation patterns 76 may pass through the first upper insulation layer 72, the stacked structure 50, the first portion 47A, and the connection mold layer 43 and may extend to an inner portion of the horizontal conductive layer 41, in the cell region CE. Each of the plurality of separation patterns 75 and the plurality of middle separation patterns 76 may pass through the first upper insulation layer 72, the interlayer insulation layer 59, the stacked structure 50, the second buried insulation layer 49, and the second portion 47B and may extend to an inner portion of the horizontal conductive layer 41, in the connection region EX.

A plurality of bit plugs 81, which pass through the first upper insulation layer 72 and are connected to the plurality of cell channel structures 69, may be formed in the cell region CE. A plurality of bit lines 83 connected to the plurality of bit plugs 81 may be formed on the first upper insulation layer 72. A second upper insulation layer 79 may be formed on the first upper insulation layer 72, the plurality of separation patterns 75, the plurality of middle separation patterns 76, and the plurality of bit lines 83.

A plurality of through electrodes 85, which pass through the second upper insulation layer 79, the first upper insulation layer 72, the interlayer insulation layer 59, the stacked structure 50, the first buried insulation layer 48, the third lower insulation layer 35, the capping layer 33, and the second lower insulation layer 31 and are connected to the plurality of peripheral circuit wirings 29, may be formed in the through electrode region EXC. The plurality of through electrodes 85 may pass through the plurality of mold layers 53M. The plurality of through electrodes 85 may be electrically connected to the plurality of transistors 25.

Each of the first upper insulation layer 72 and the second upper insulation layer 79 may include a compound including Si and O, a compound including Si and N, silicon oxide, silicon nitride, silicon oxynitride, low-K dielectrics, high-K dielectrics, or a combination thereof. For example, each of the first upper insulation layer 72 and the second upper insulation layer 79 may include a silicon oxide layer. The plurality of bit plugs 81, the plurality of bit lines 83, and the plurality of through electrodes 85 may each include metal, metal nitride, metal silicide, metal oxide, conductive carbon, polysilicon, or a combination thereof.

Referring again to FIGS. 1 to 3, a plurality of upper wirings 87 connected to the plurality of through electrodes 85 may be formed on the second upper insulation layer 79. The plurality of upper wirings 87 may include metal, metal nitride, metal silicide, metal oxide, conductive carbon, polysilicon, or a combination thereof.

Figure 39:
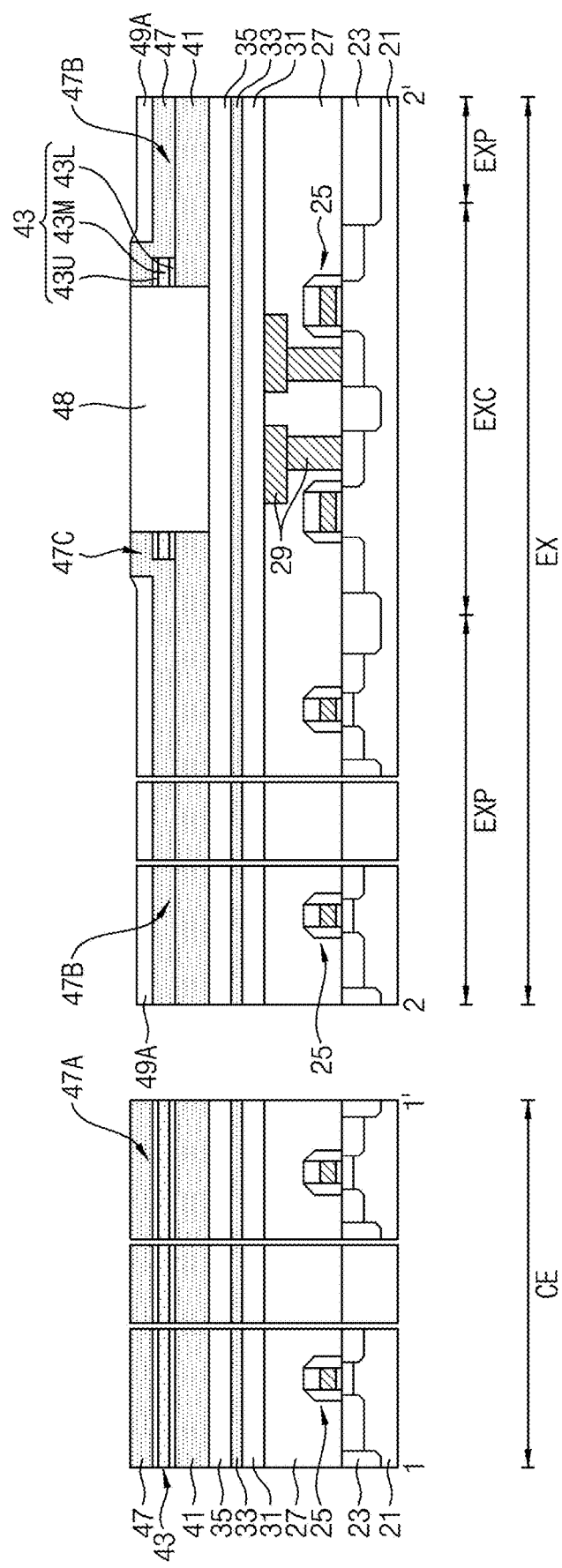
Figure 40:
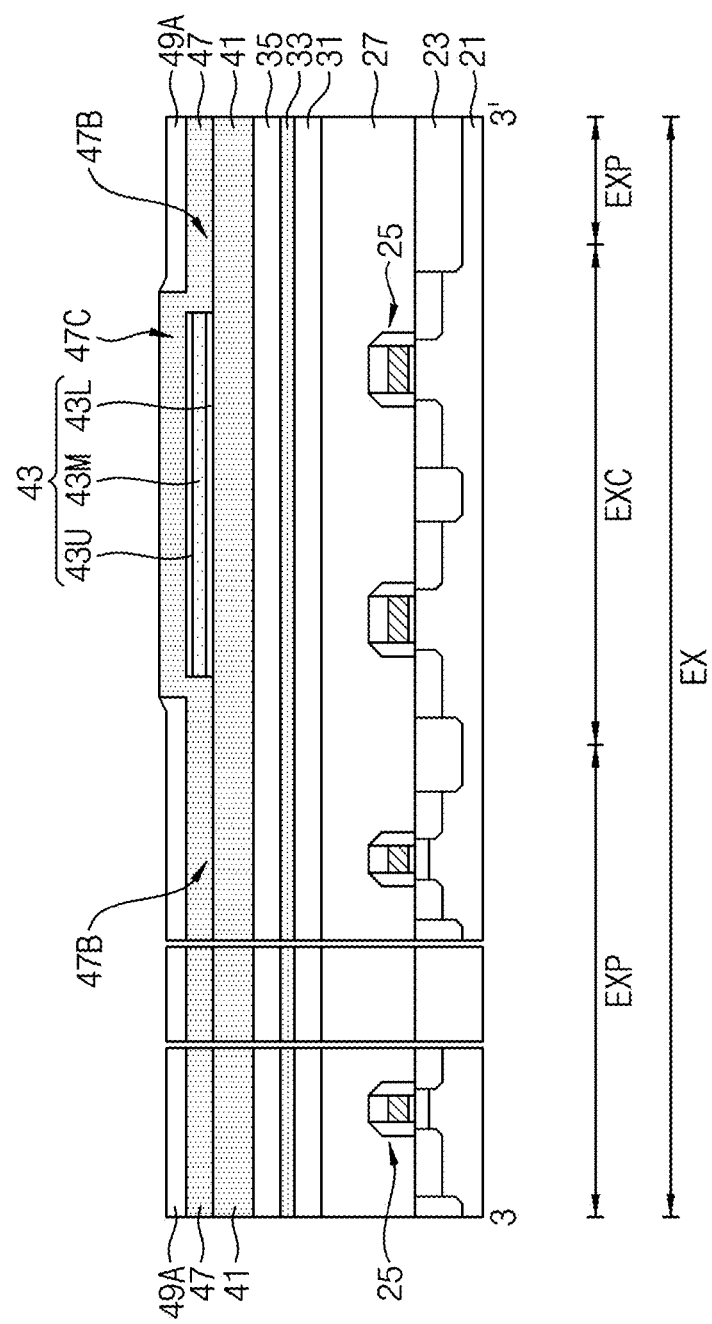

FIG. 39 is a cross-sectional view taken along lines 1-1' and 2-2' of FIG. 3, for describing methods of manufacturing semiconductor devices according to example embodiments of the disclosure, and FIG. 40 is a cross-sectional view taken along line 3-3' of FIG. 3, for describing methods of manufacturing semiconductor devices.

Referring to FIGS. 3, 39, and 40, a top surface of a second buried insulation layer 49A may be formed at a level which is lower than top surfaces of a first portion 47A and a third portion 47C. A distance between the top surface of the second buried insulation layer 49A and a top surface of a substrate 21 may be shorter than a distance between a top surface of the third portion 47C and the top surface of the substrate 21. The distance between the top surface of the second buried insulation layer 49A and the top surface of the substrate 21 may be shorter than a distance between a top surface of the first portion 47A and the top surface of the substrate 21. In some example embodiments, the top surface of the second buried insulation layer 49A may be formed at a level which is lower than the top surfaces of the first portion 47A, the third portion 47C, and a first buried insulation layer 48.

Figure 41:
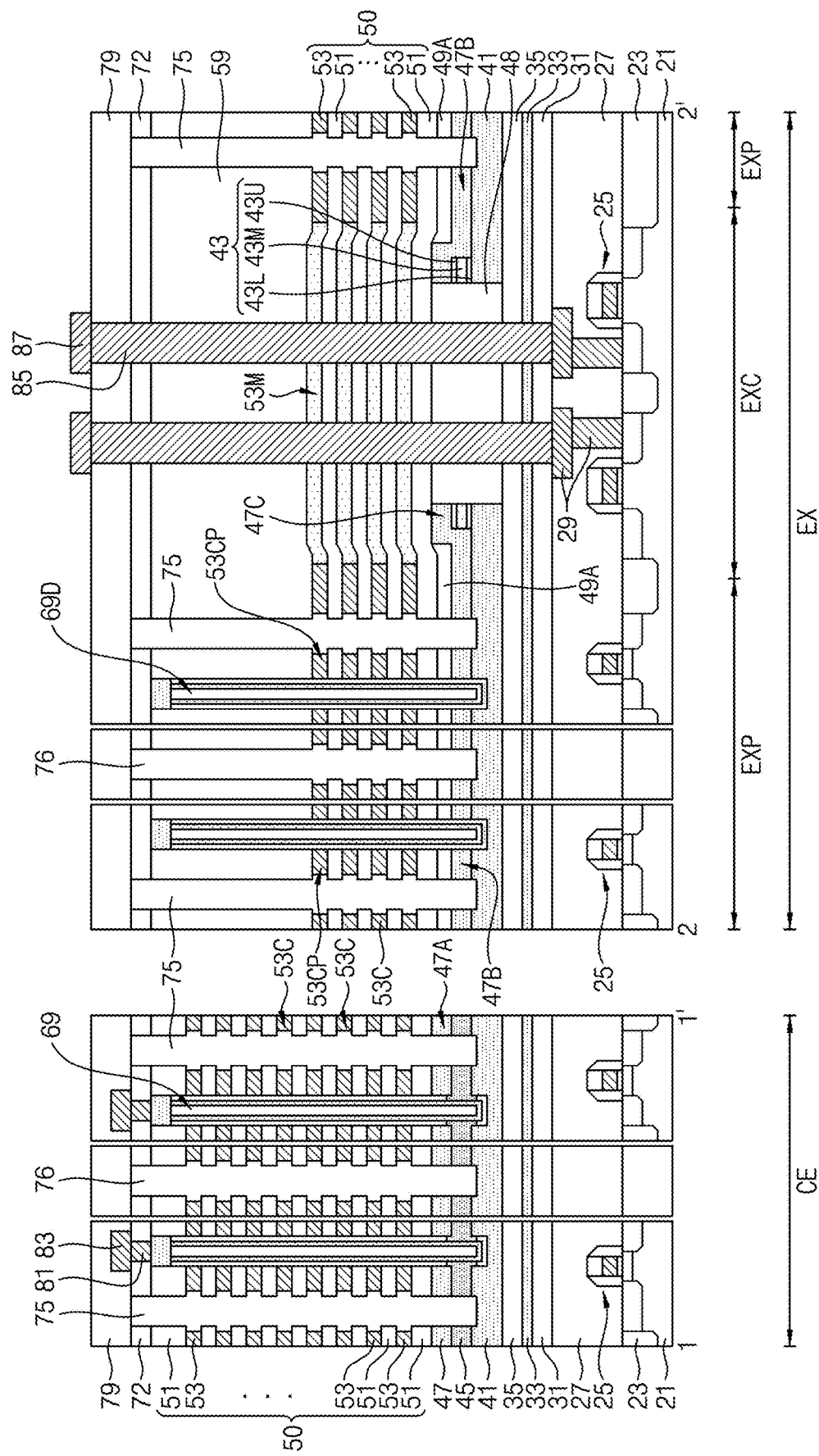
FIGS. 41 to 43 are cross-sectional views for describing semiconductor devices according to example embodiments of the disclosure.
Figure 42:
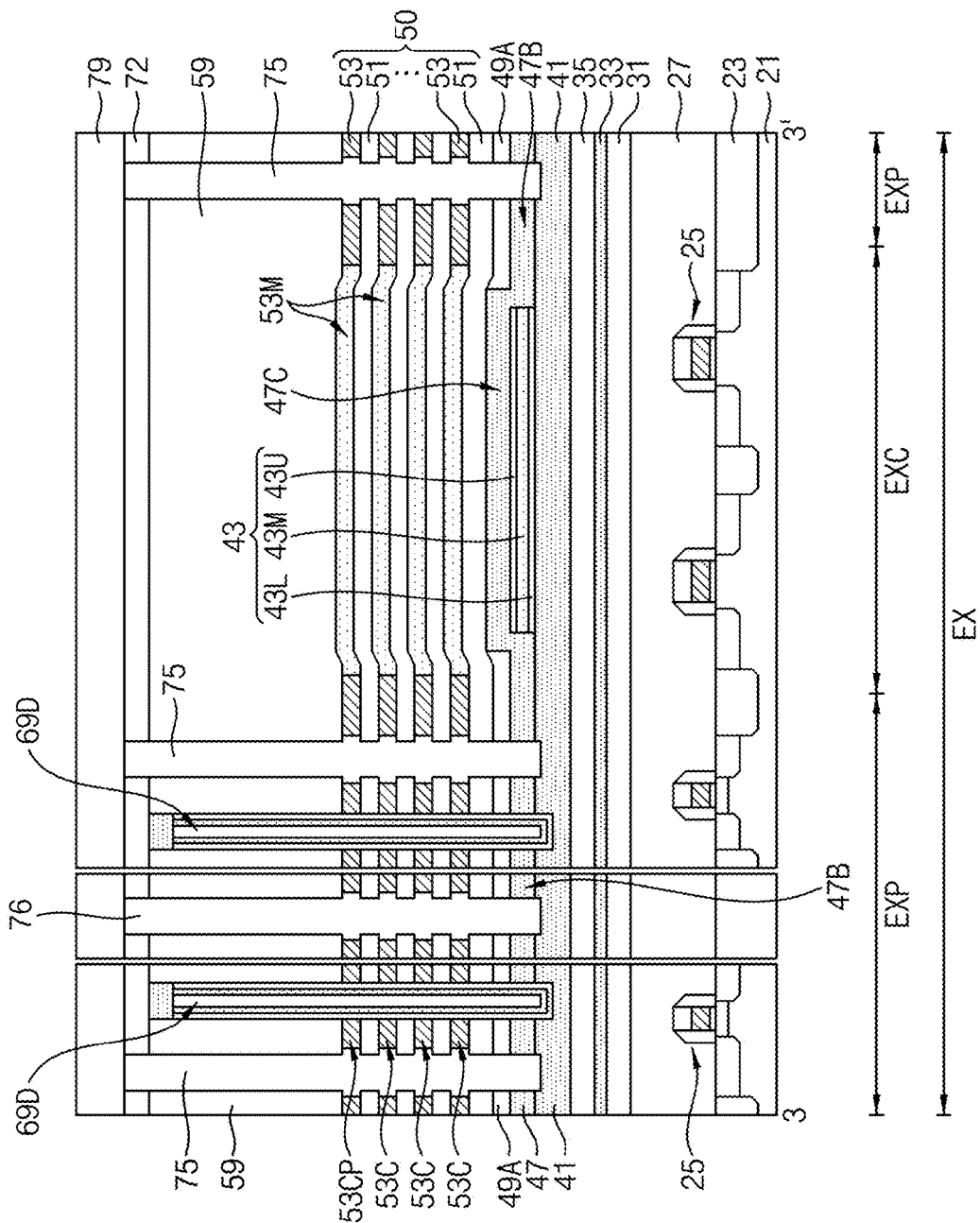
Figure 43:
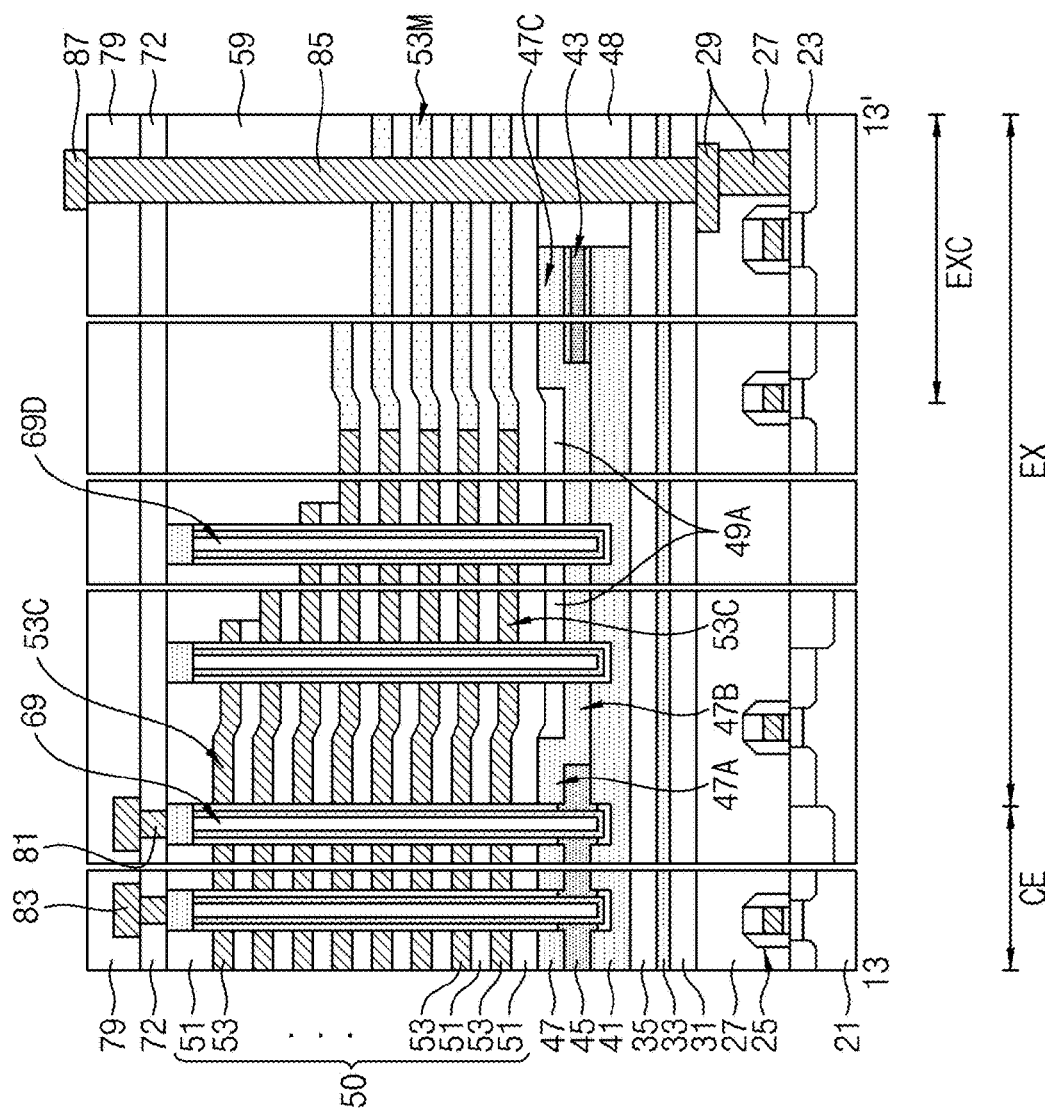

FIG. 41 is a cross-sectional view taken along lines 1-1' and 2-2' of FIG. 3, for describing semiconductor devices according to example embodiments of the disclosure, FIG. 42 is a cross-sectional view taken along line 3-3' of FIG. 3, for describing semiconductor devices, and FIG. 43 is a cross-sectional view taken along line 13-13' of FIG. 3, for describing semiconductor devices.

Referring to FIGS. 3 and 41 to 43, a top surface of a second buried insulation layer 49A may be formed at a level which is lower than top surfaces of a first portion 47A and a third portion 47C. A lowermost wiring layer of the plurality of wiring layers 53 may include a first region overlapping the first portion 47A, a second region overlapping the second portion 47B, and a third region overlapping the third portion 47C. A top surface of the third region may be formed at the same or substantially the same level as a top surface of the first region. A top surface of the second region may be formed at a level which is lower than the top surfaces of the first region and the third region.

Each of the plurality of wiring layers 53 may include an electrode layer 53C and a mold layer 53M connecting with a side surface of the electrode layer 53C. The mold layer 53M may be aligned on the first buried insulation layer 48 and the third portion 47C. The mold layer 53M may overlap the first buried insulation layer 48 and the third portion 47C. A horizontal width of the mold layer 53M may be greater than that of the first buried insulation layer 48. The horizontal width of the mold layer 53M may be greater than that of the third portion 47C. Each of the first region and the second region may include the electrode layer 53C. The third region may include the mold layer 53M.

According to some example embodiments of the disclosure, a supporter including a first portion, a second portion formed at a level which is lower than the first portion, and a third portion formed at the same level as the first portion may be provided. A first buried insulation layer passing through the third portion may be disposed. A second buried insulation layer may be disposed on the second portion. A leakage current between a wiring layer and the supporter may be considerably reduced. The third portion of the supporter may perform a function of enabling top surfaces of the first portion, the first buried insulation layer, the third portion, and the second buried insulation layer to maintain a coplanar surface while a planarization process is being performed. Accordingly, semiconductors for increasing or maximizing production efficiency and/or reducing or minimizing a leakage current may be implemented.

Hereinabove, the example embodiments of the disclosure have been described with reference to the accompanying drawings, but it may be understood that those skilled in the art may implement the embodiments in another detailed form without changing the inventive concepts or the essential feature. It should be understood that the example embodiments described above are merely examples in all aspects and are not limited.

What is claimed is:
1. A semiconductor device comprising:
   a substrate including a cell region and a connection region connecting with the cell region, the connection region including a plurality of pad regions and a through electrode region between the plurality of pad regions;
   a horizontal conductive layer on the substrate;
   a supporter on the horizontal conductive layer, the supporter including a first portion in the cell region, a second portion in the plurality of pad regions, and a third portion in the through electrode region;
   a connection conductive layer between the first portion of the supporter and the horizontal conductive layer;
   a connection mold layer between the third portion of the supporter and the horizontal conductive layer;
   a first buried insulation layer in the through electrode region to pass through the third portion, the connection mold layer, and the horizontal conductive layer;
   a cell channel structure in the cell region to pass through a stacked structure where a plurality of insulation layers and a plurality of wiring layers are alternately stacked and the first portion and extend to an inner portion of the horizontal conductive layer; and
   a through electrode in the through electrode region to pass through the first buried insulation layer.

2. The semiconductor device of claim 1, wherein top surfaces of the third portion and the first portion are substantially coplanar.

3. The semiconductor device of claim 1, wherein a distance between an uppermost end of the second portion and a top surface of the substrate is shorter than a distance between an uppermost end of the first portion and the top surface of the substrate.

4. The semiconductor device of claim 1, wherein a bottom surface of the second portion contacts the horizontal conductive layer.

5. The semiconductor device of claim 1, wherein top surfaces of the first portion, the third portion, and the first buried insulation layer are substantially coplanar.

6. The semiconductor device of claim 1, wherein
   the stacked structure extends to an inner portion of each of the plurality of pad regions, and
   a minimum interval between a corresponding wiring layer of the plurality of wiring layers and the second portion is greater than a minimum interval between the corresponding wiring layer and the first portion.

7. The semiconductor device of claim 1, wherein
the stacked structure extends to an inner portion of each of the plurality of pad regions and the through electrode region,
each of the plurality of wiring layers comprises an electrode layer and a mold layer connecting with a side surface of the electrode layer, and
a minimum interval between the electrode layer and the third portion is greater than a minimum interval between the electrode layer and the first portion.

8. The semiconductor device of claim 7, wherein
the mold layer is aligned on the first buried insulation layer, and
the through electrode passes through the mold layer.

9. The semiconductor device of claim 1, wherein a thickness of the connection mold layer is substantially the same as an interval between the first portion and the horizontal conductive layer.

10. The semiconductor device of claim 1, wherein
the stacked structure extends to an inner portion of each of the plurality of pad regions,
the semiconductor device further comprises a second buried insulation layer between the second portion and the stacked structure, and
top surfaces of the first portion, the third portion, the first buried insulation layer, and the second buried insulation layer are substantially coplanar.

11. The semiconductor device of claim 1, wherein
the stacked structure extends to an inner portion of each of the plurality of pad regions,
the semiconductor device further comprises a second buried insulation layer between the second portion and the stacked structure,
a distance between a top surface of the second buried insulation layer and a top surface of the substrate is shorter than a distance between an uppermost end of the first portion and the top surface of the substrate, and
the distance between the top surface of the second buried insulation layer and the top surface of the substrate is shorter than a distance between an uppermost end of the third portion and the top surface of the substrate.

12. The semiconductor device of claim 1, wherein
the stacked structure extends to an inner portion of each of the plurality of pad regions and the through electrode region,
each of the plurality of wiring layers comprises an electrode layer and a mold layer connecting with a side surface of the electrode layer, and
the semiconductor device further comprises a second buried insulation layer between the second portion and the stacked structure,
the mold layer is aligned on the first buried insulation layer, and
the mold layer has a width which is greater than a width of the first buried insulation layer.

13. The semiconductor device of claim 12, wherein
the third mold layer overlaps the third portion, and
the mold layer has a width which is greater than a width of the third portion.

14. The semiconductor device of claim 12, wherein
a lowermost wiring layer of the plurality of wiring layers comprises a first region overlapping the first portion, a second region overlapping the second portion, and a third region overlapping the third portion,
a top surface of the third region is at substantially the same level as a top surface of the first region, and
a top surface of the second region is at a level which is lower than the top surfaces of the first region and the third region.

15. The semiconductor device of claim 14, wherein the third region of the lowermost wiring layer comprises the mold layer.

16. A semiconductor device comprising:
a substrate including a cell region and a connection region connecting with the cell region, the connection region including a plurality of pad regions and a through electrode region between the plurality of pad regions;
a horizontal conductive layer on the substrate;
a supporter on the horizontal conductive layer, the supporter including a first portion in the cell region, a second portion in the plurality of pad regions, and a third portion in the through electrode region;
a connection conductive layer between the first portion of the supporter and the horizontal conductive layer;
a connection mold layer between the third portion of the supporter and the horizontal conductive layer;
a first buried insulation layer in the through electrode region to pass through the third portion, the connection mold layer, and the horizontal conductive layer;
a second buried insulation layer in the plurality of pad regions to cover the second portion;
a stacked structure where a plurality of insulation layers and a plurality of wiring layers are alternately stacked on the supporter, the first buried insulation layer, and the second buried insulation layer;
a cell channel structure in the cell region to pass through the stacked structure and the first portion and extend to an inner portion of the horizontal conductive layer;
a dummy channel structure in the plurality of pad regions to pass through the stacked structure, the second buried insulation layer, and the second portion and extend to an inner portion of the horizontal conductive layer; and
a through electrode in the through electrode region to pass through the stacked structure and the first buried insulation layer.

17. The semiconductor device of claim 16, wherein
a distance between a top surface of the second buried insulation layer and a top surface of the substrate is shorter than a distance between an uppermost end of the first portion and the top surface of the substrate, and
the distance between the top surface of the second buried insulation layer and the top surface of the substrate is shorter than a distance between an uppermost end of the third portion and the top surface of the substrate.

18. The semiconductor device of claim 16, wherein
a lowermost wiring layer of the plurality of wiring layers comprises a first region overlapping the first portion, a second region overlapping the second portion, and a third region overlapping the third portion,
a top surface of the third region is at substantially the same level as a top surface of the first region, and
a top surface of the second region is at a level which is lower than the top surfaces of the first region and the third region.

19. A semiconductor device comprising:
a substrate including a cell region and a connection region connecting with the cell region, the connection region including a plurality of pad regions and a through electrode region between the plurality of pad regions;
a horizontal conductive layer on the substrate;
a supporter on the horizontal conductive layer, the supporter including a first portion in the cell region, a second portion in the plurality of pad regions, and a third portion in the through electrode region;

a connection conductive layer between the first portion of the supporter and the horizontal conductive layer;

a connection mold layer between the third portion of the supporter and the horizontal conductive layer;

a first buried insulation layer in the through electrode region to pass through the third portion, the connection mold layer, and the horizontal conductive layer;

a second buried insulation layer in the plurality of pad regions to cover the second portion;

a cell channel structure in the cell region to pass through a stacked structure where a plurality of insulation layers and a plurality of wiring layers are alternately stacked and the first portion and extend to an inner portion of the horizontal conductive layer;

a through electrode in the through electrode region to pass through the first buried insulation layer; and a bit line on the stacked structure and connected to the cell channel structure.

20. The semiconductor device of claim 19, wherein top surfaces of the first portion, the third portion, the first buried insulation layer, and the second buried insulation layer are substantially coplanar.

\* \* \* \* \*